US012558826B2

(12) United States Patent
Ferran Palau et al.

(10) Patent No.: US 12,558,826 B2
(45) Date of Patent: Feb. 24, 2026

(54) ELECTRICAL ASSEMBLY HAVING A CONDUCTIVE AND MAGNETIC MEMBER

(71) Applicant: Lear Corporation, Southfield, MI (US)

(72) Inventors: Joan Ignasi Ferran Palau, Valls (ES); Oscar Cano Salomo, Valls (ES); Antoni Pujol Simon, Valls (ES); Joan Gomis, Valls (ES); Jose Gabriel Fernández Bañares, Valls (ES)

(73) Assignee: Lear Corporation, Southfield, MI (US)

( * ) Notice: Subject to any disclaimer, the term of this patent is extended or adjusted under 35 U.S.C. 154(b) by 727 days.

(21) Appl. No.: 17/335,552

(22) Filed: Jun. 1, 2021

(65) Prior Publication Data

US 2022/0386490 A1    Dec. 1, 2022

(51) Int. Cl.
| | |
|---|---|
| *B29C 45/14* | (2006.01) |
| *G01R 15/20* | (2006.01) |
| *G01R 19/00* | (2006.01) |
| *H01F 27/29* | (2006.01) |
| *H05K 1/18* | (2006.01) |
| *H05K 1/181* | (2026.01) |

(52) U.S. Cl.
CPC ...... *B29C 45/14819* (2013.01); *G01R 15/202* (2013.01); *G01R 19/0092* (2013.01); *H01F 27/292* (2013.01); *H05K 1/181* (2013.01)

(58) Field of Classification Search
CPC ............ B29C 45/14819; G01R 15/202; G01R 19/0092; H01F 27/292; H05K 1/181
See application file for complete search history.

(56) References Cited

U.S. PATENT DOCUMENTS

| | | | |
|---|---|---|---|
| 6,515,468 | B1 | 2/2003 | Morimoto et al. |
| 7,106,046 | B2 | 9/2006 | Nagano et al. |
| 7,476,953 | B2 | 1/2009 | Taylor et al. |
| 7,545,136 | B2 * | 6/2009 | Racz .................... G01R 15/207 |
| | | | 324/117 R |
| 7,663,358 | B2 | 2/2010 | Hashio et al. |
| 10,705,570 | B2 | 7/2020 | Kuna |
| 2017/0370969 | A1 * | 12/2017 | Okuyama ............ G01R 15/205 |
| 2019/0195920 | A1 * | 6/2019 | Tramet ................. H05K 5/0247 |
| 2019/0212372 | A1 * | 7/2019 | Bilbao De Mendizabal ............... |
| | | | G01R 33/09 |

(Continued)

FOREIGN PATENT DOCUMENTS

| | | |
|---|---|---|
| CN | 109962629 A | 7/2019 |
| CN | 110875974 A | 3/2020 |
| EP | 2916634 A2 | 9/2015 |

OTHER PUBLICATIONS

Melexis, Current Sensors Reference Design Guide, May 2019.

(Continued)

*Primary Examiner* — Lisa M Caputo
*Assistant Examiner* — Nyla Gavia
(74) *Attorney, Agent, or Firm* — Fishman Stewart PLLC

(57) ABSTRACT

An electrical assembly may include an electrically conductive first member, a magnetic second member, and/or a housing molded on the first member and the second member. A method of assembling an electrical assembly may include disposing the first member in contact with a first mold, disposing the second member in contact with the first mold, moving a second mold into contact with the first mold, and/or inserting a housing material (e.g., liquid plastic) into the first mold and the second mold to form the housing.

19 Claims, 31 Drawing Sheets

(56)          References Cited

U.S. PATENT DOCUMENTS

| 2020/0271696 A1 * | 8/2020 | Nakada | ................... | G01R 31/42 |
| 2021/0373050 A1 * | 12/2021 | Houis | ................ | G01R 19/0092 |

OTHER PUBLICATIONS

Chinese Office Action and Search Report, CN202210629597.0, dated Jun. 27, 2025 (w_machine_translation).
German Office Action, DE 10 2022 113 823.2, dated Mar. 5, 2025 (w_translation).

* cited by examiner

700

702 Provide 1st + 2nd Members

704 Dispose on 1st Mold

706 Move 2nd Mold

708 Mold Housing on/around 1st + 2nd Members

710 Connect with Circuit Board

ELECTRICAL ASSEMBLY HAVING A CONDUCTIVE AND MAGNETIC MEMBER

TECHNICAL FIELD

The present disclosure generally relates to electrical assemblies, including electrical assemblies that may, for example, be utilized in connection with measuring electrical current, such as in a vehicle.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies may include complex designs and/or involve significant tolerances (e.g., manufacturing, assembly, etc.) between components that may result in inconsistent operation and/or sensing.

There is a desire for solutions/options that minimize or eliminate one or more challenges or shortcomings of electrical sensors. The foregoing discussion is intended only to illustrate examples of the present field and is not a disavowal of scope.

SUMMARY

In embodiments, an electrical assembly may include an electrically conductive first member, a magnetic second member, and/or a housing molded on the first member and the second member. A method of assembling an electrical assembly may include disposing the first member in contact with a first mold, disposing the second member in contact with the first mold, moving a second mold into contact with the first mold, and/or inserting a housing material (e.g., liquid plastic) into the first mold and the second mold to form the housing.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
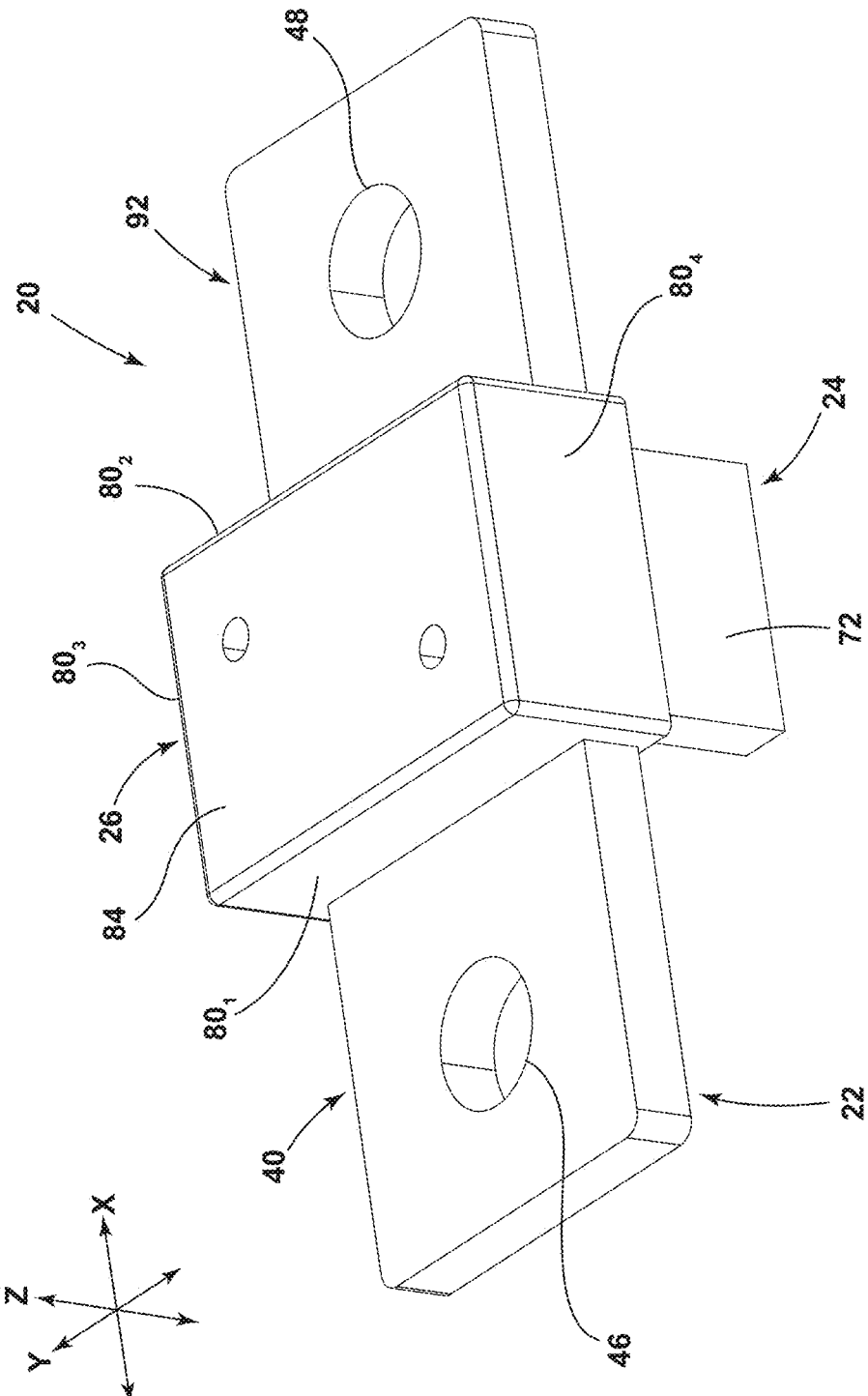
FIGS. 1 and 2 are perspective views generally illustrating embodiments of electrical assemblies.
Figure 2:
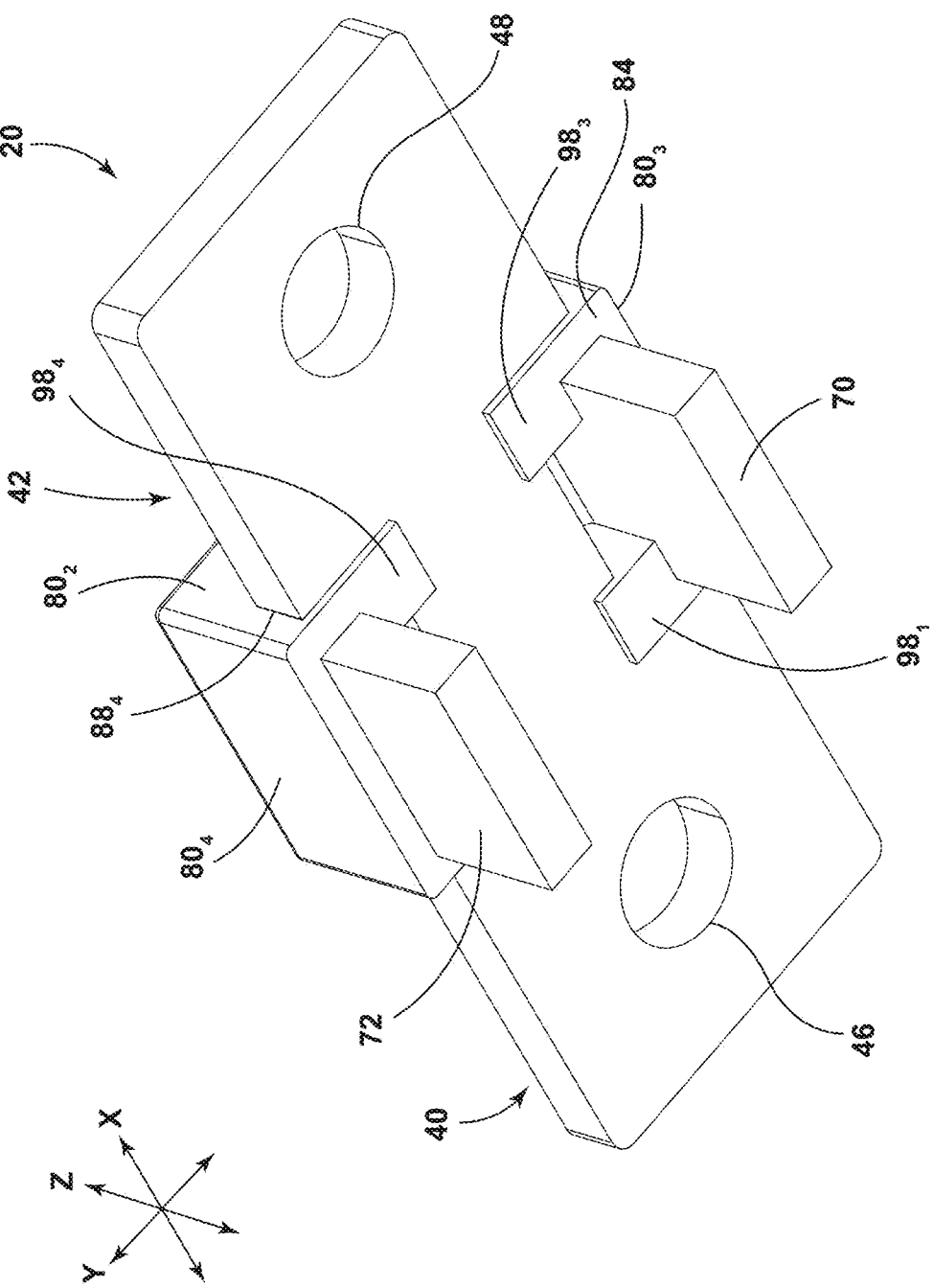

In embodiments, such as generally illustrated in FIGS. 1 and 2, an electrical assembly 20 may include a first member 22, a second member 24, and/or a housing 26. The first member 22 may, for example and without limitation, be electrically conductive and/or include an electrical conductor (e.g., a bus bar). The second member 24 may, for example and without limitation, include a concentrator and/or a magnetic material.

Figure 3:
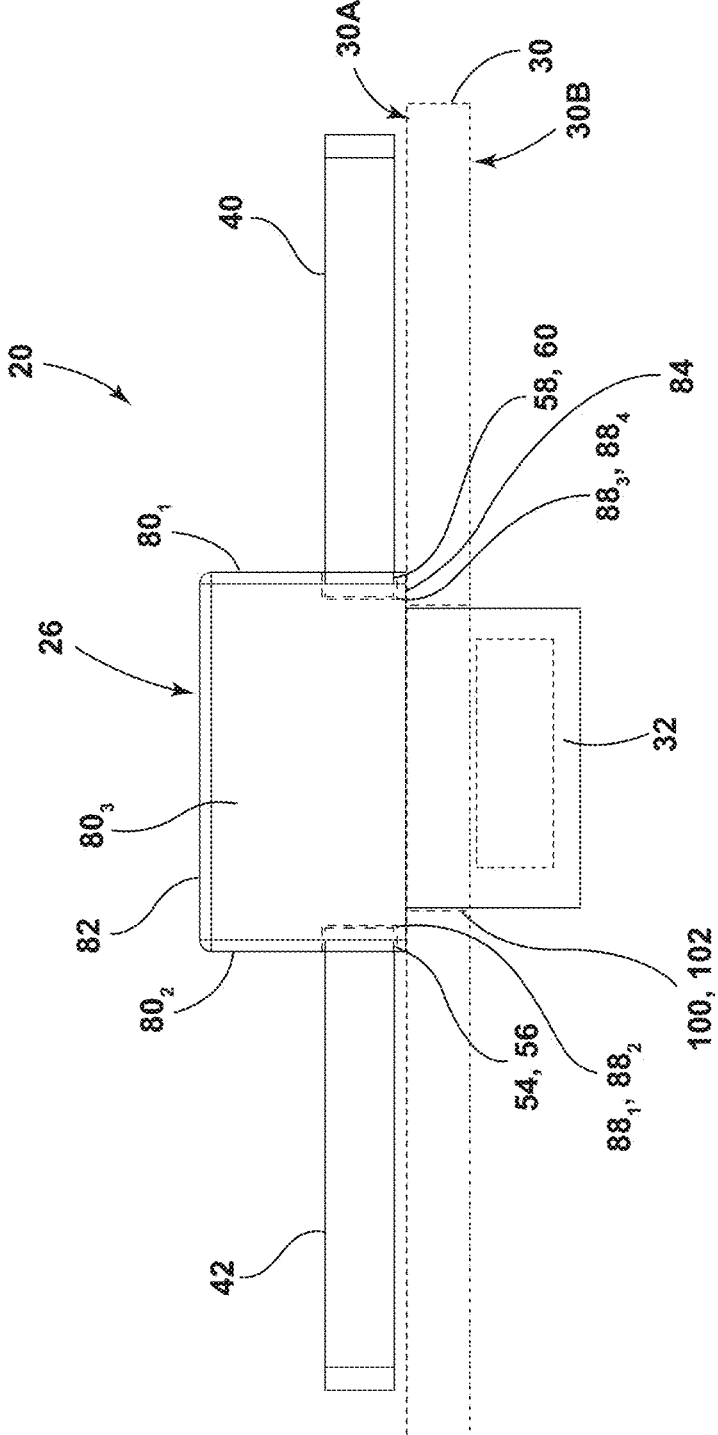
FIG. 3 is a side view generally illustrating an embodiment an electrical assembly.

With embodiments, such as generally illustrated in FIG. 3, an electrical assembly 20 may include a circuit board 30 and/or a sensor 32. The sensor 32 may be configured to obtain/sense information about electrical current flowing through the first member 22. The sensor 32 may, for example and without limitation, include a Hall effect sensor. The second member 24 may be configured to facilitate sensing by the sensor 32, such as via concentrating magnetic fields generated via the electrical current.

Figure 4:
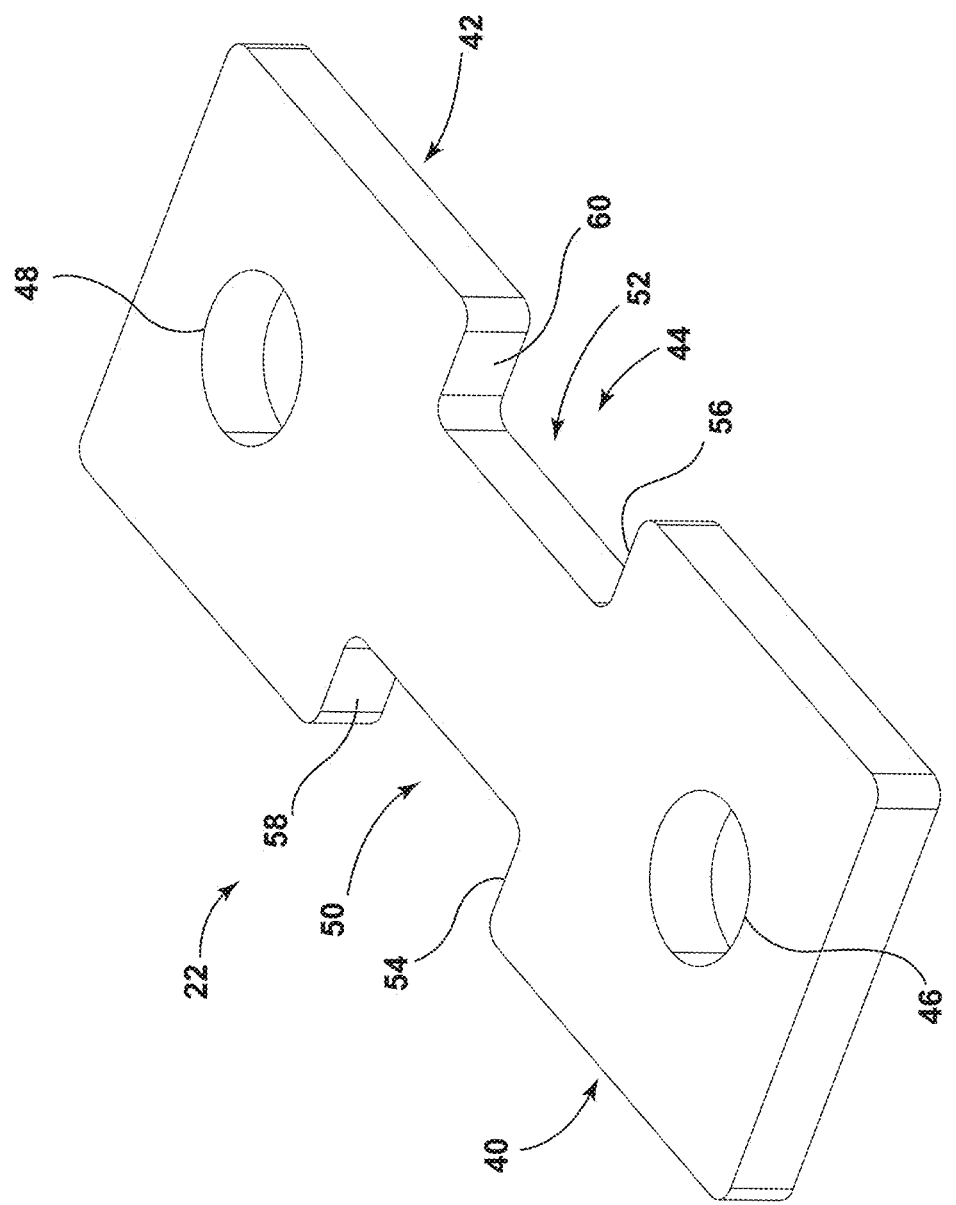
FIG. 4 is a perspective view generally illustrating an embodiment of a first member of an electrical assembly.

In embodiments, a first member 22 may include one or more of a variety of shapes, sizes, configurations, and/or materials. For example, as generally illustrated in FIG. 4, a first member 22 may include a generally rectangular configuration and may include a first portion 40, a second portion 42, and/or a third portion 44. A first portion 40 and/or a second portion 42 may be wider (e.g., in a lateral/Y-direction) than the third portion 44. For example, the first portion 40 may be referred to as a first wide portion, the second portion 42 may be referred to as a second wide portion, and/or the third portion 44 may be referred to as a narrow portion. The first portion 40 and/or the second portion 42 may include an aperture 46, 48 (e.g., a through aperture) that may be configured to receive a fastener, such as to connect the first member 22 with respective electrical components. The portions 40, 42, 44 may define a first recess 50 and/or a second recess 52 that may, for example, include generally rectangular shapes. The first recess 50 and/or the second recess 52 may be provided in lateral sides (e.g., opposite lateral sides) of the first member 22.

With embodiments, a first portion 40 may include a first edge portion 54 and/or a second edge portion 56 that may be disposed proximate and/or partially define the first recess 50 and the second recess 52, respectively. The second portion 42 may include a third edge portion 58 and/or a fourth edge portion 60 that may be disposed proximate and/or partially define the first recess 50 and the second recess 52. The first member 22 may, at least in some configurations, be substantially planar (e.g., parallel to an X-Y plane).

Figure 5:
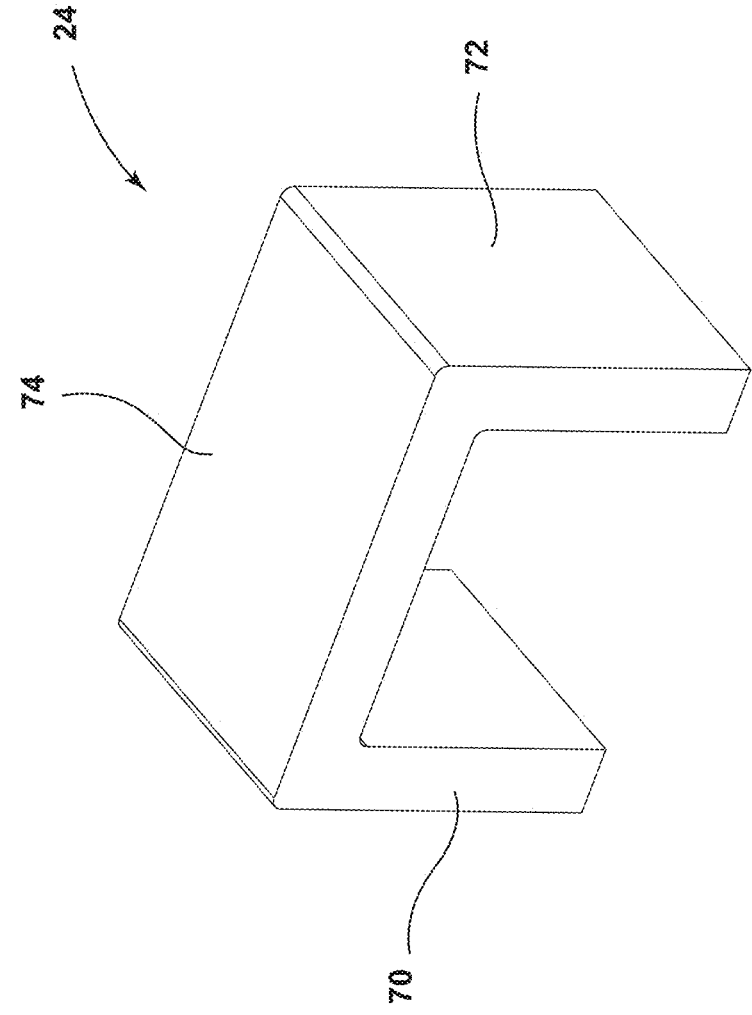
FIG. 5 is a perspective view generally illustrating an embodiment of a second member of an electrical assembly.

In embodiments, a second member 24 may include one or more of a variety of shapes, sizes, configurations, and/or materials. For example, as generally illustrated in FIG. 5, a second member may include a first portion 70, a second portion 72, and/or a third portion 74 that may be disposed in a generally U-shaped or C-shaped configuration that may open downward. The first portion 70 and/or the second portion 72 may be configured as legs, and the third portion 74 may be configured as a middle portion that may connect the first portion 70 and the second portion 72. The first portion 70 and the second portion 72 may be substantially planar and/or parallel to each other (e.g., parallel to a X-Z plane). The third portion 74 may be substantially planar and/or perpendicular to the first portion 70 and/or the second portion 72. The third portion 74 may, for example, be substantially parallel with an X-Y plane and/or the first member 22. The second member 24 may, at least in some configurations, include a ferromagnetic material and/or may be configured to concentrate magnetic fields generated via current flowing through the first member 22 to facilitate sensing by the sensor 32 (e.g., for sensing an amount of current flowing through the first member 22).

Figure 6:
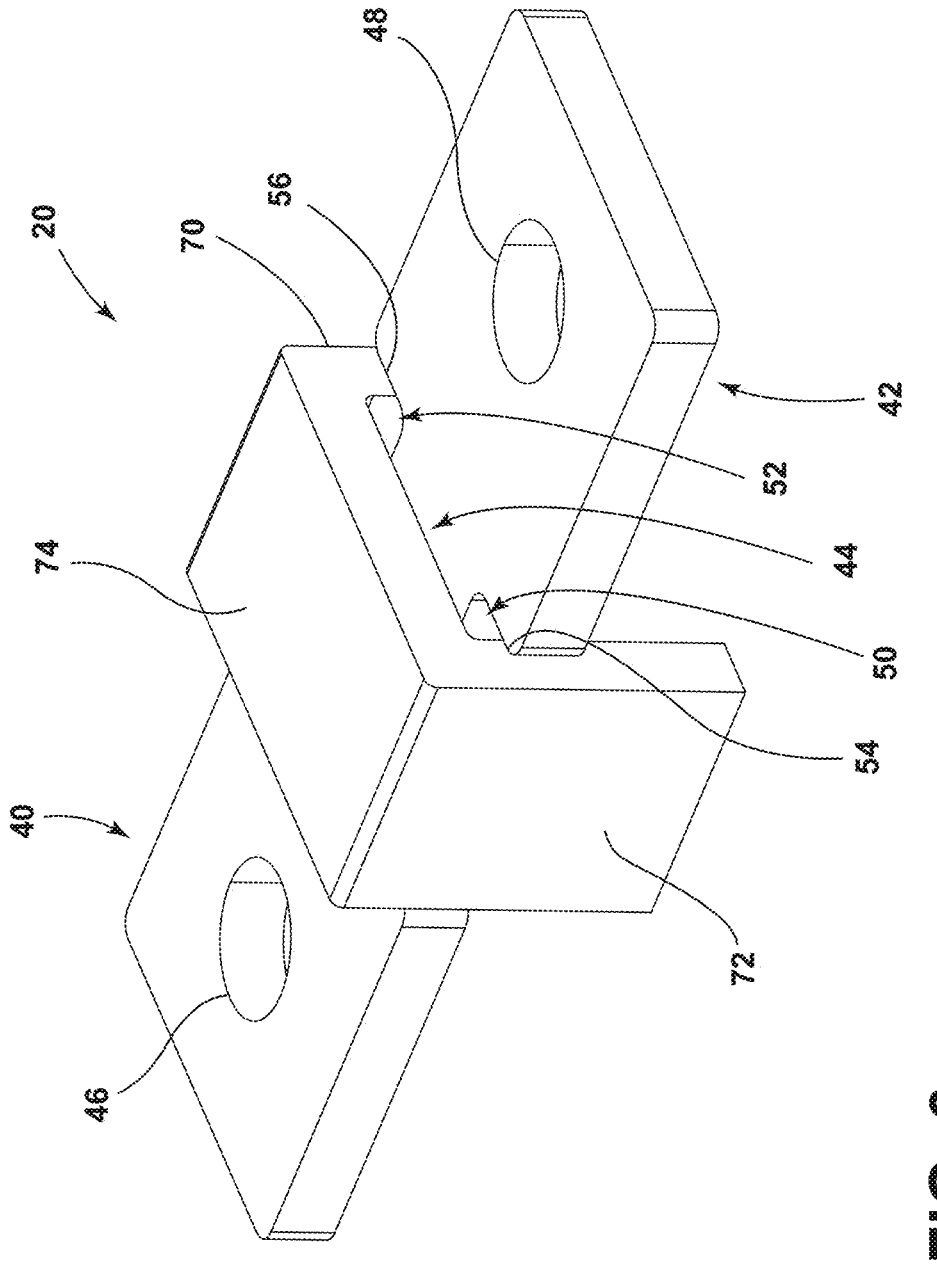
FIG. 6 is a perspective view generally illustrating embodiments of a first member and a second member of an electrical assembly.

With embodiments, such as generally illustrated in FIG. 6, in an assembled configuration, a second member 24 may be disposed on/over a first member 22. A housing 26 is hidden/not shown in FIG. 6 for viewing clarity. The third portion 44 of the first member 22 may, for example be disposed between (e.g., in a Y-direction) the first portion 70 and the second portion 72 of the second member 24. The first portion 70 of the second member 24 may be disposed at least partially in the first recess 50 such that the first and second portions 40, 42 of the first member 22 and the first portion 70 of the second member 24 overlap in an X-direction (e.g., a longitudinal direction of the first member 22). The second portion 72 of the second member 24 may be disposed at least partially in the second recess 52 such that the first and second portions 40, 42 of the first member 22 and the second portion 72 of the second member 24 overlap in an X-direction. The second member 24 may substantially cover three sides of at least some of the first member 22, such as some or substantially all of the third portion 44. Inner surfaces of the second member 24 may be disposed at distances from the first member 22 such that the first member 22 and the second member 24 are not in contact with each other. In some embodiments, the width of the second member 24 may be wider than the width of the first member 22. For example, the third portion 74 may be wider, at least to some degree, than the first, second, and third portions 40-44 of the first member 22 such that the first and second portions 70, 72 of the second member 24 are disposed at least partially beyond the first member 22 and/or the recesses 50, 52 (e.g., in a Y-direction).

Figure 7:
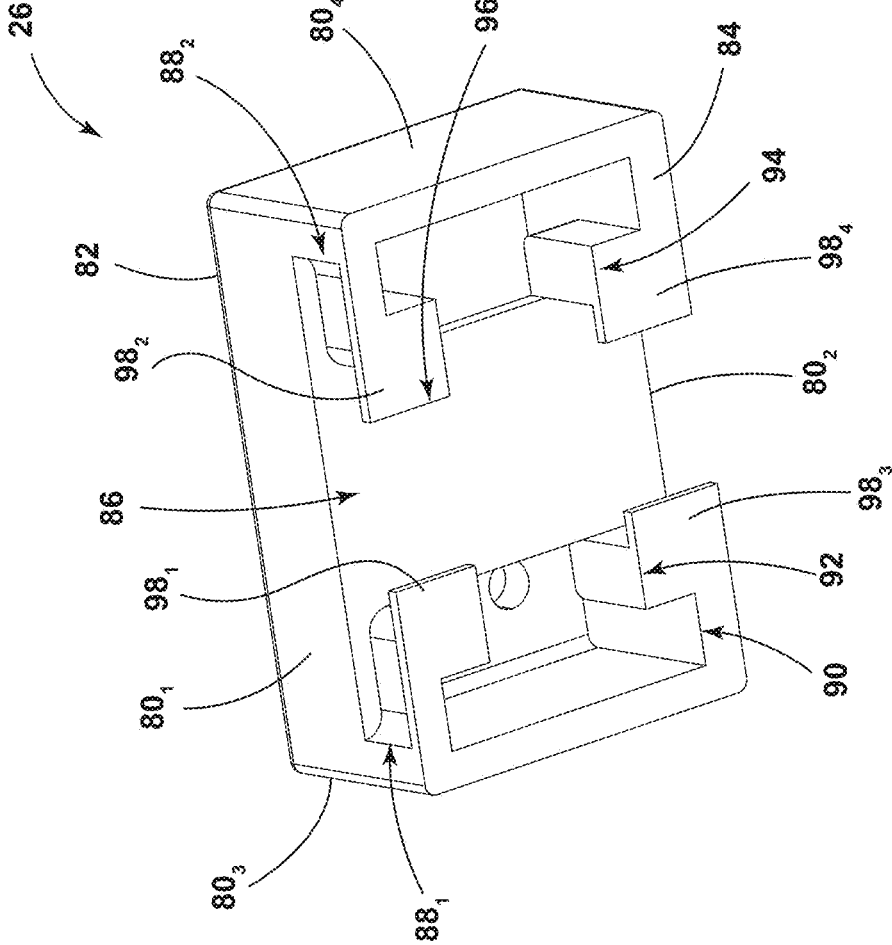
FIG. 7 is a perspective view generally illustrating an embodiment of a housing of an electrical assembly.
Figure 8:
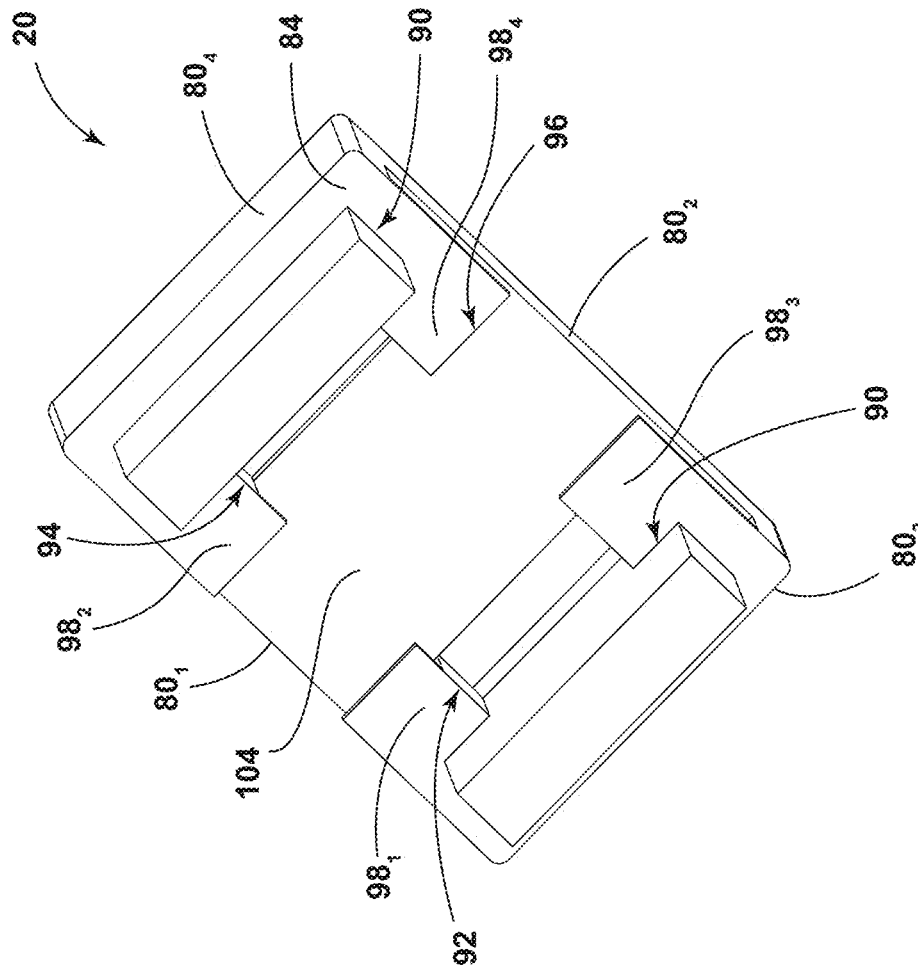
FIG. 8 is a perspective view generally illustrating embodiments of a second member and a housing of an electrical assembly.
Figure 9:
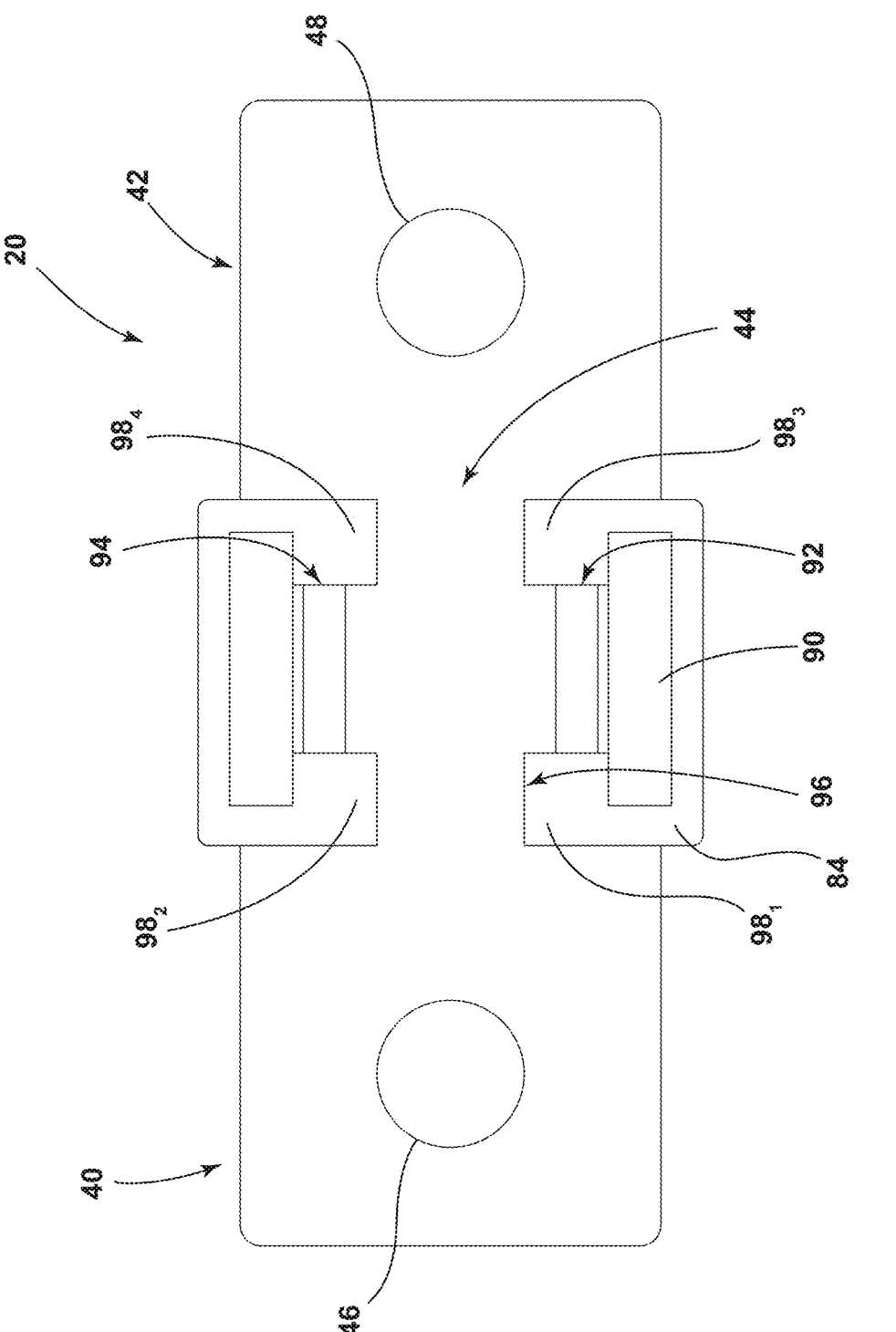
FIG. 9 is a bottom view generally illustrating an embodiment an electrical assembly.

With embodiments, a housing 26 may include one or more of a variety of shapes, sizes, configurations, and/or materials. For example, as generally illustrated in FIG. 7, a housing 26 may include a configuration that may generally resemble a rectangular prism with side walls 80 (e.g., side walls $80_{1-4}$), a top wall 82, and/or a bottom wall 84. A first side wall $80_1$ and a second side wall $80_2$ may be substantially parallel to each other and/or a Y-Z plane. A third side wall $80_3$ and/or a fourth side wall $80_4$ may be substantially parallel to each other and/or an X-Z plane. A housing 26 may include an aperture 86 (e.g., a through aperture) that may extend from the first side wall $80_1$ to the second side wall $80_2$, and/or that may be formed at least partially in the bottom wall 84. The aperture 86 may, for example, be configured to receive the first member 22. The first side wall $80_1$ may be opposite the second side wall $80_2$, such as in a longitudinal/X-direction. The third side wall $80_3$ may be opposite the fourth side wall $80_4$, such as in a lateral/Y-direction. The top wall 82 may be opposite the bottom wall 84, such as in a vertical/Z-direction.

In embodiments, a housing 26 may include one or more recesses 88 (e.g., external recesses), such as a first recess $88_1$, a second recess $88_2$, a third recess $88_3$, and/or a fourth recess $88_4$. The first recess $88_1$ and/or the second recess $88_2$ may be provided in the first side wall $80_1$ and may be configured to at least partially receive the first edge portion 54 and a second edge portion 56, respectively. The third recess $88_3$ and/or the fourth recess $88_4$ may be provided in the second side wall $80_2$ and may be configured to at least partially receive the third edge portion 58 and a fourth edge portion 60, respectively. The recesses 88 may be disposed at a distance $D_1$ from the bottom wall 84. The distance $D_1$ may correspond to a desired distance for the first member 22 to be disposed above the circuit board 30. The height of the recesses 88 may, for example, be the about the same as the thickness/height of the first member 22 (e.g., in a Z-direction).

With embodiments, a housing 26 may include a second member recess 90. The second member recess 90 may include a shape that may correspond to the shape of the second member 24. For example and without limitation, the second member recess 90 may be generally U-shaped, may extend from the bottom wall 84, through sections of the third side wall 80₃, through sections of the top wall 82, through sections of the fourth side wall 80₄, and/or to/though the bottom wall 84. The second member recess 90 may include a first extension 92 that may extend inward toward a middle of the housing 26 and/or may include a second extension 94 that may extend inward toward the middle of the housing 26. For example, the first extension 92 and the second extension 94 may extend toward each other (e.g., in a Y-direction). The lengths of the extensions 92, 94 (e.g., in the X-direction) may be shorter than the length of the second member recess 90. The extensions 92, 94 may, for example, be configured to offset (e.g., in the Y-direction) the second member 24 from the first member 22 such that gaps (e.g., air gaps) are present between the first member 22 and the second member 24 on both lateral sides of the first member 22. The extensions 92, 94 may, at least in some embodiments, provide portions of the second member recess 90 with a generally T-shaped configuration, such as portions disposed in the first side wall 80₁ and/or the second side wall 80₂. Portions of the second member recess 90 disposed in the top wall 82 may, for example, include substantially the same shape as the third portion 74 of the second member 24 (e.g., may be rectangular).

In embodiments, such as generally illustrated in FIG. 7, an extension 96 of the aperture 86 may extend to/through a bottom wall 84 of the housing 26. The extensions 96 may not be as wide (e.g., in a Y-direction) as a remainder of the aperture 86, which may provide the aperture 86 with a generally T-shaped configuration (viewed from an X-direction) and/or provide the housing 26 with one or more protrusions 98 (e.g., feet). The one or more protrusions 98 may include a first protrusion 98₁, a second protrusions 98₂, a third protrusion 98₃, and/or a fourth protrusion 98₄. The first protrusion 98₁ may be provided by the first side wall 80₁, the third side wall 80₃, and/or the bottom wall 84, and/or may be defined by the second member recess 90, the first extension 92 of the second member recess 90, the aperture 86, and/or the extension 96 of the aperture 86. The second protrusion 98₂ may be provided by the first side wall 80₁, the fourth side wall 80₄, and/or the bottom wall 84, and/or may be defined by the second member recess 90, the first extension 92 of the second member recess 90, the aperture 86, and/or the extension 96 of the aperture 86. The third protrusion 98₃ may be provided by the second side wall 80₂, the third side wall 80₃, and/or the bottom wall 84, and/or may be defined by the second member recess 90, the second extension 94 of the second member recess 90, the aperture 86, and/or the extension 96 of the aperture 86. The fourth protrusion 98₄ may be provided by the second side wall 80₂, the fourth side wall 80₄, and/or the bottom wall 84, and/or may be defined by the second member recess 90, the second extension 94 of the second member recess 90, the aperture 86, and/or the extension 96 of the aperture 86.

With embodiments, the one or more protrusions 98 may, for example and without limitation, include rectangular and/or square configurations. Bottom surfaces of the one or more protrusions 98 may, in an assembled configuration, be in contact with a first/top surface 30A of the circuit board 30 and/or top surfaces of the one or more protrusions may be in contact with a lower surface of the first member 22. A height of the one or more protrusions 98 may be the same as the distance $D_1$ and/or the bottom wall 84, and/or may define the spacing of the first member 22 from the circuit board 30 and/or the sensor 32 (e.g., in the Z-direction).

With embodiments, such as generally illustrated in FIGS. 1-3 and 8-12, in an assembled configuration, a housing 26 may cover and/or be formed on and/or around portions of the first member 22 and/or the second member 24. For example, in some configurations, a housing 26 may cover substantially all of the top and X-direction side surfaces of the third portion 74 of the second member 24, and/or may cover a majority of a bottom surface of the third portion 74 (see, e.g., FIG. 8). In other configurations, a housing 26 may cover some of the top surface of the third portion 74 (e.g., via a beam-type structure or other structure) such that the second member 24 is retained relative to the housing 26, but at least a section of the top surface of the third portion 74 is exposed/not covered by the housing 26. The housing 26 may completely surround (e.g., be wrapped around and on) one or more sections of the second member 24, such as a middle section of the third portion 74 (see, e.g., FIGS. 10-12).

In embodiments, such as generally illustrated in FIGS. 3 and 10-12, a first portion 70 and/or a second portion 72 of a second member 24 may extend through apertures 100, 102 of the circuit board 30. The sensor 32 may be disposed at and/or on a second surface 30B of a circuit board 30 and/or may be disposed at least partially between (e.g., in a Y-direction) sections of the first portion 70 and the second portion 72 that extend through the second surface 30B to a second side of the circuit board 30. The first portion 70 and/or the second portion 72 may extend beyond the sensor 32, such as in a Z-direction and/or in one or both X-directions.

Figure 10:
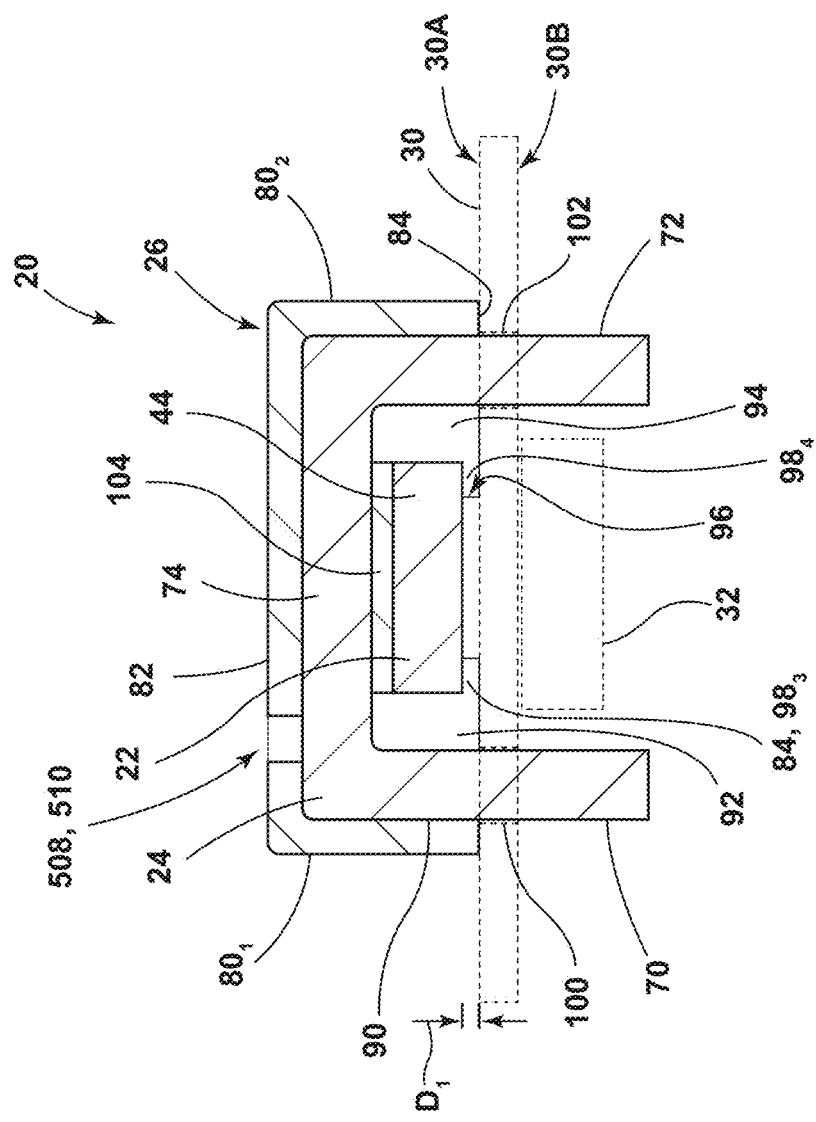
FIGS. 10 and 11 are cross-sectional views generally illustrating embodiments of electrical assemblies.
Figure 11:
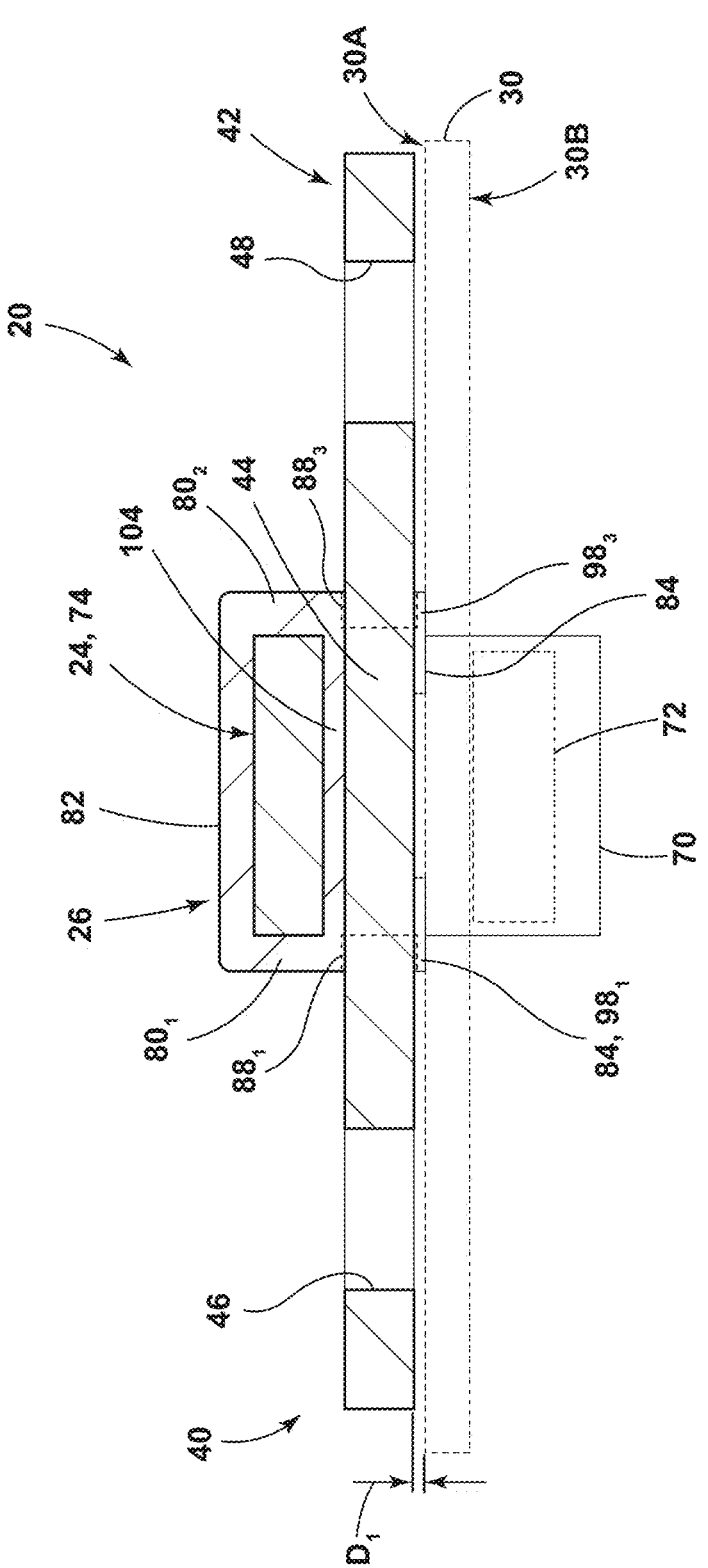
Figure 12:
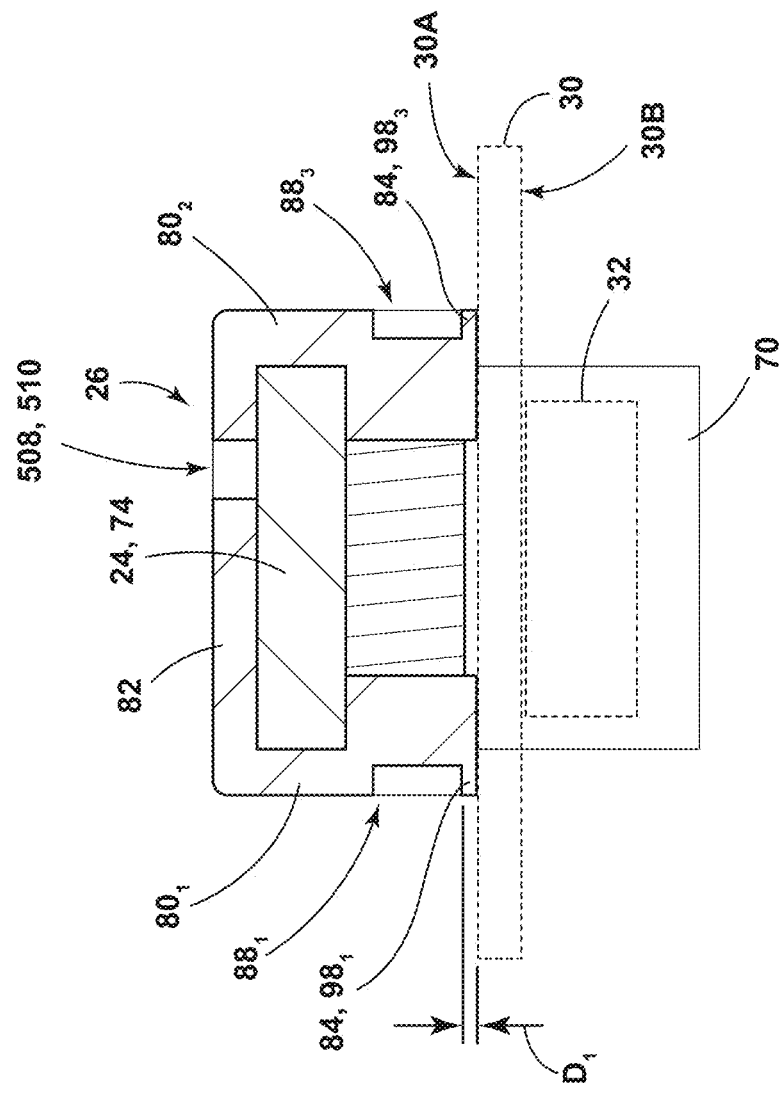
FIG. 12 is a cross-sectional view generally illustrating an embodiment of an electrical assembly with a first member hidden.

With embodiments, such as generally illustrated in FIGS. 10 and 11, a portion 104 of the housing 26 may be disposed between (e.g., in a Z-direction) the first member 22 and the second member 24. The portion 104 may, for example, be disposed at least partially between the third portion 44 of the first member 22 and the third portion 74 of the second member 24. The portion 104 may, for example, be substantially planar and/or rectangular. A height of the portion 104 may define a distance between the first member 22 and the second member 24. The portion 104 may be in contact with an upper surface of the third portion 44 of the first member 22 and/or may be in contact with a lower surface of the third portion 74 of the second member 24. A second member 24 may be disposed at least partially between portions of a housing 26, such as between a top wall 82 that may be disposed on a top surface of the second member 24 and a portion 104 that may be disposed on a bottom surface of the second member 24. A first member 22 may be disposed between portions of a housing 26, such as between a portion 104 that may be disposed on a top surface of the first member 22 and a bottom wall 84 that may be disposed on a bottom surface of the first member 22.

Figure 13:
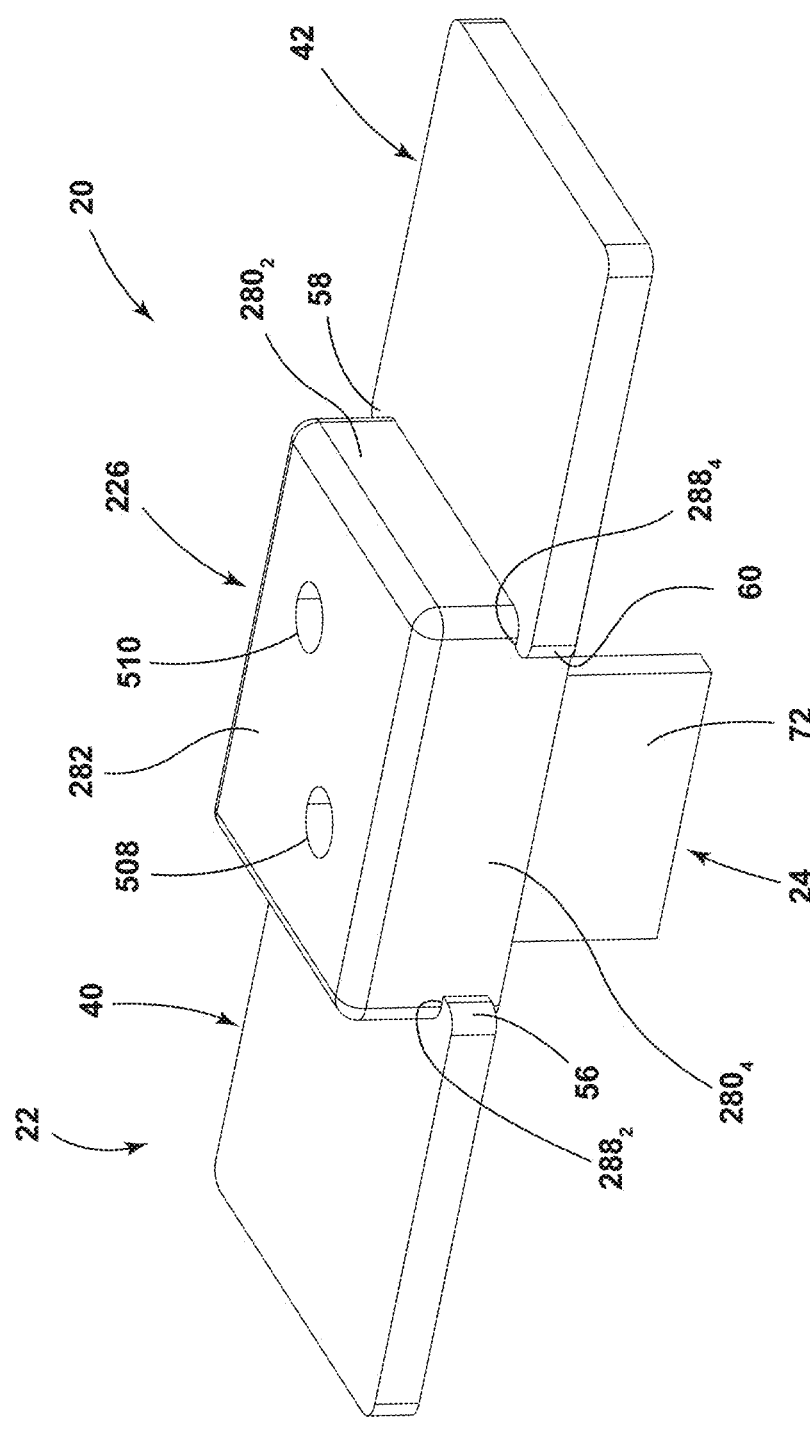
FIGS. 13 and 14 are perspective views generally illustrating embodiments of electrical assemblies.
Figure 14:
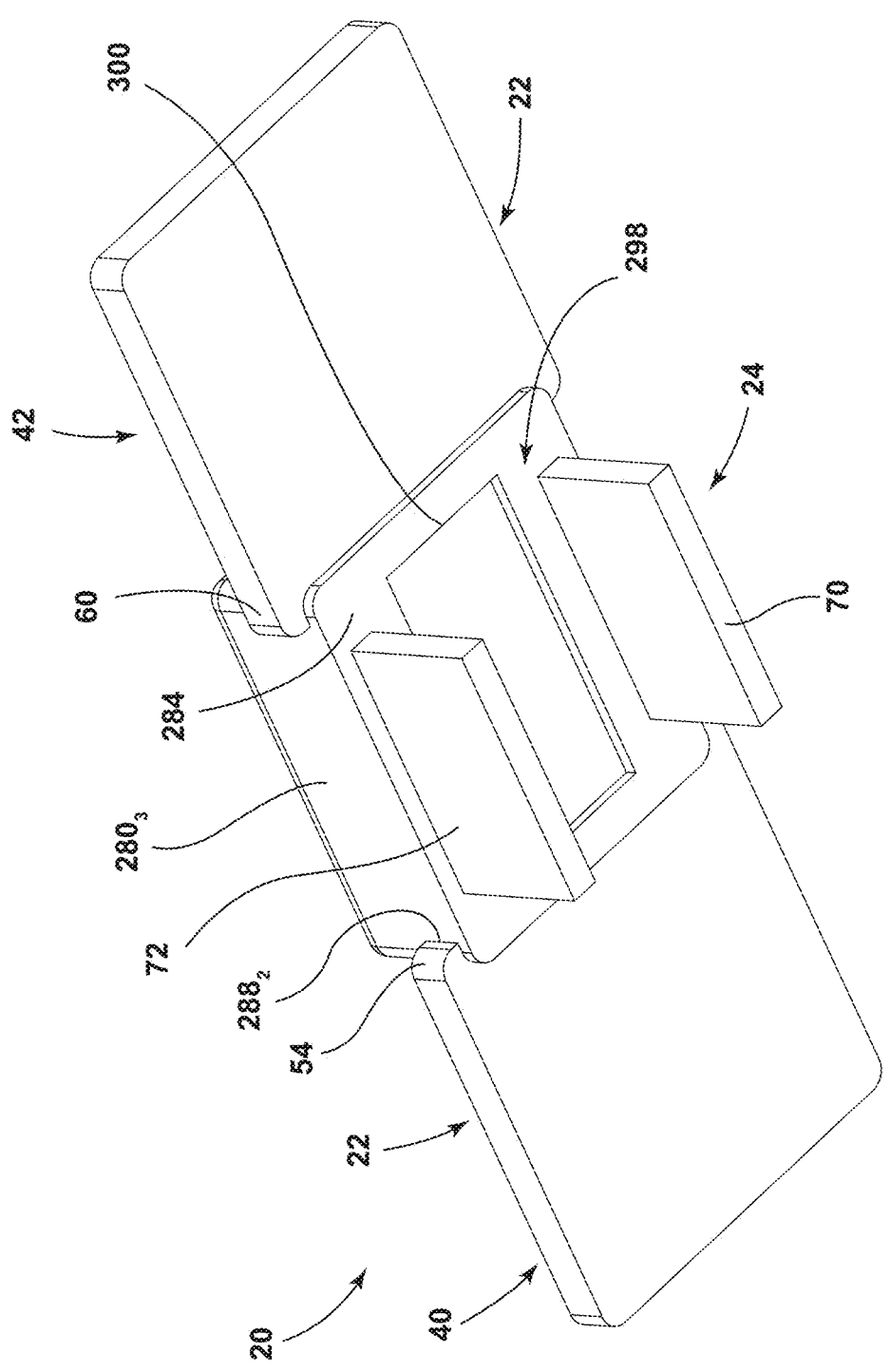
Figure 15:
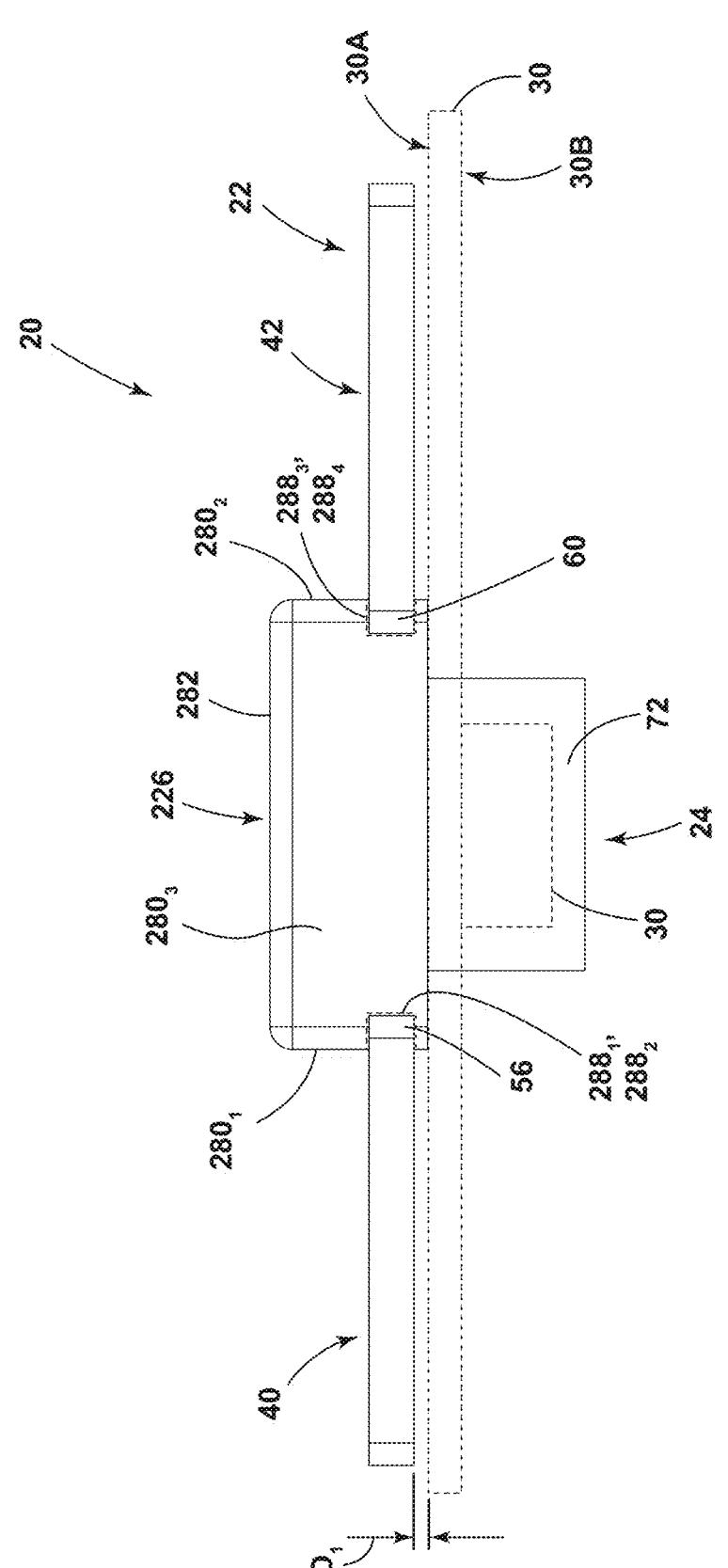
FIG. 15 is a side view generally illustrating an embodiment an electrical assembly.

With embodiments, such as generally illustrated in FIGS. 13-15, an electrical assembly 20 may include a first member 22, a second member 24, and/or a housing 226.

Figure 16:
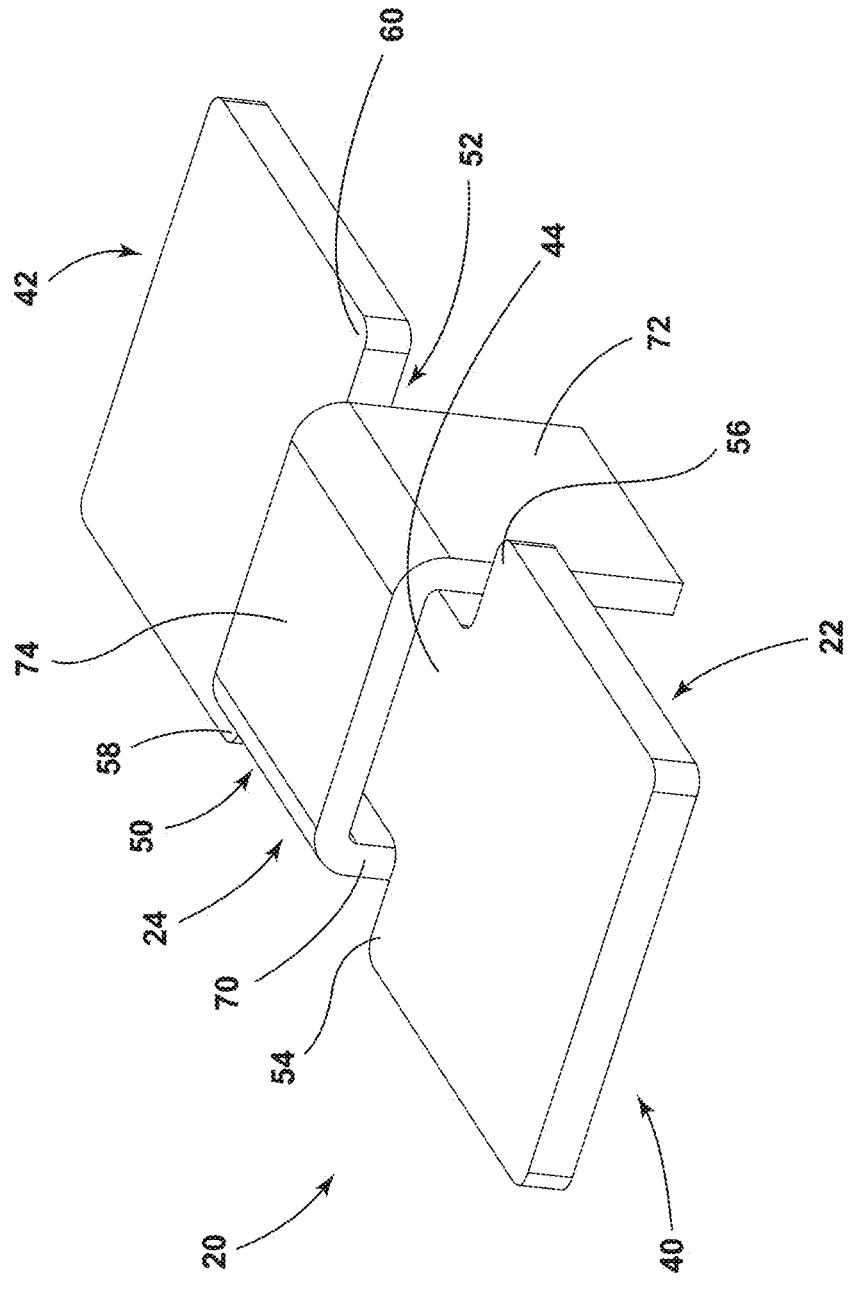
FIG. 16 is a perspective view generally illustrating embodiments of a first member and a second member of an electrical assembly.

In embodiments, such as generally illustrated in FIG. 16, a second member 24 may be narrower (e.g., in a Y-direction) than at least some sections (e.g., the first and second portions 40, 42) of the first member 22. For example and without limitation, the third portion 74 of the second member 24 may be wider than the third portion 44 of the first member 22, but may be narrower than the first portion 40 and/or the second portion 42 of the first member 22 such that the first portion 70 and the second portion 72 of the second member 24 do not extend beyond the recesses 50, 52, respectively (e.g., in the Y-direction).

Figure 17:
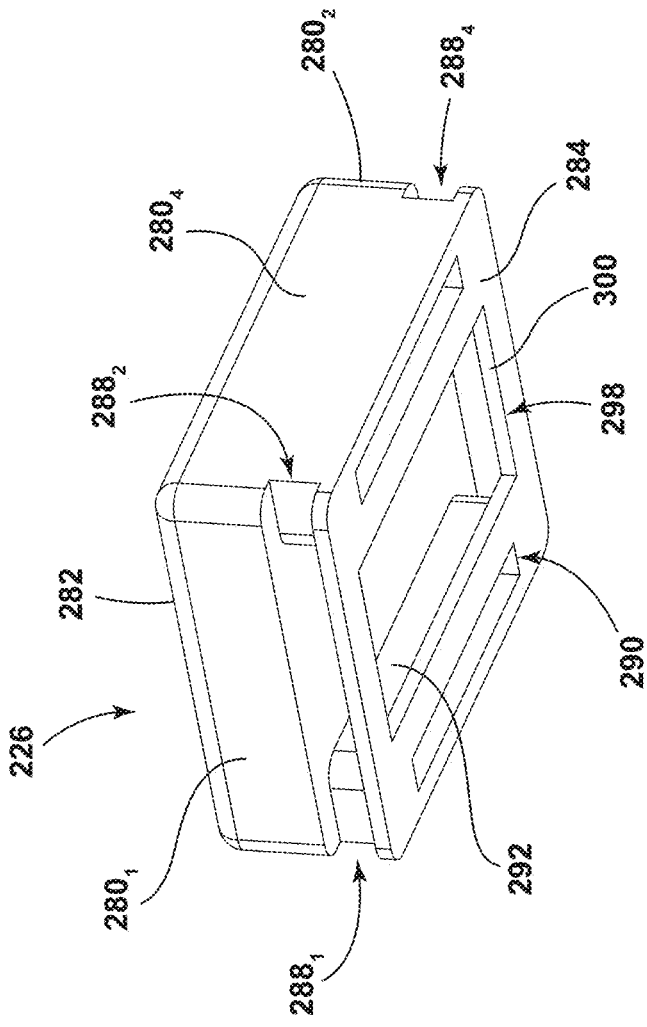
FIG. 17 is a perspective view generally illustrating an embodiment of a housing of an electrical assembly.
Figure 18:
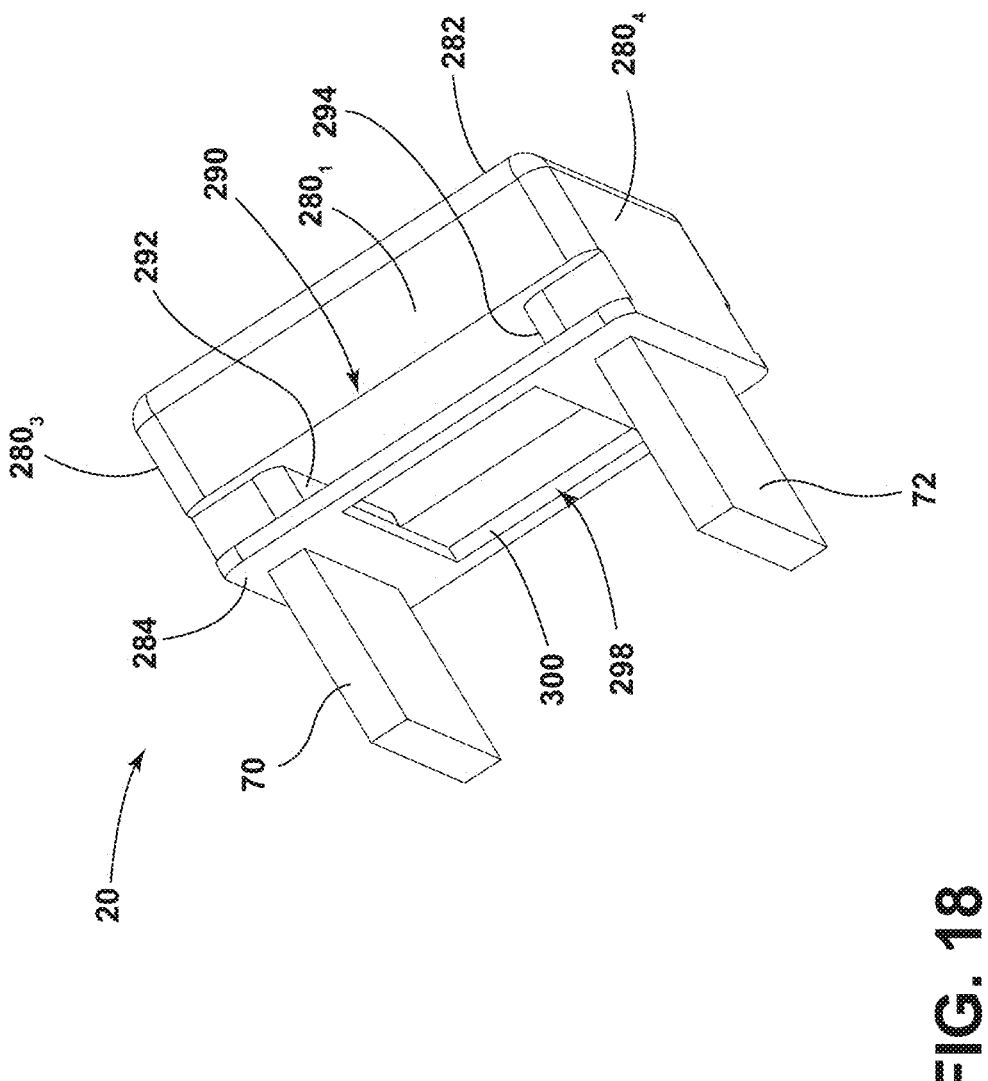
FIG. 18 is a perspective view generally illustrating embodiments of a second member and a housing of an electrical assembly.
Figure 19:
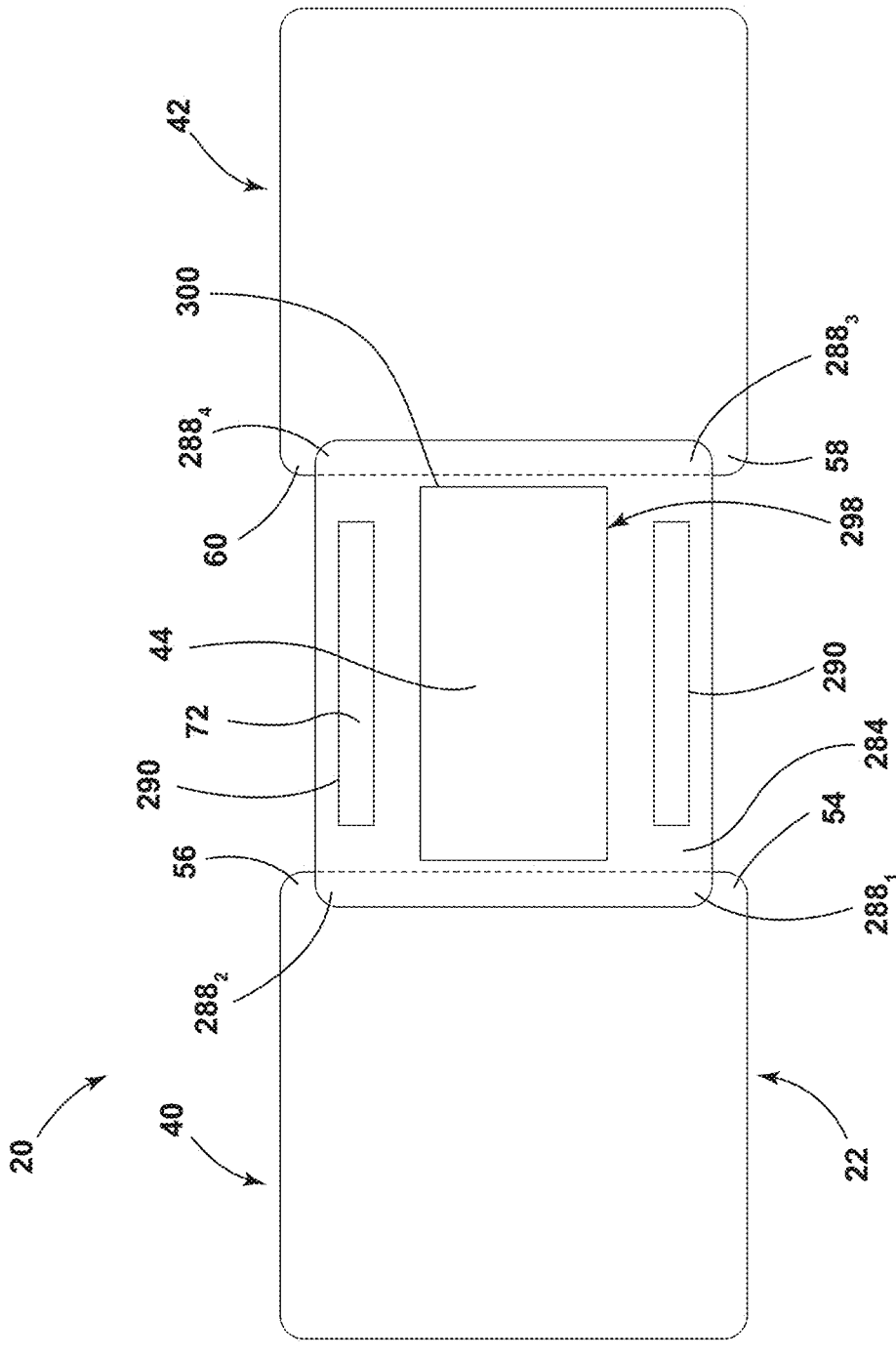
FIG. 19 is a bottom view generally illustrating an embodiment an electrical assembly.

With embodiments, such as generally illustrated in FIGS. 17 and 18, a housing 226 may include a configuration similar to that of the housing 26. For example and without limitation, the housing 226 may include side walls 280 (e.g., side walls 280$_{1-4}$), a top wall 282, a bottom wall 284, an aperture 286, one or more recesses 288, and/or a second member recess 290.

In embodiments, the second member recess 290 may not include extensions like extensions 92, 94 such that the housing 226 may be in contact (e.g., full contact) with some or all inner, outer, and/or side surfaces of the sections of the second member 24 that are disposed in the housing 26 and/or at or above the first surface 30A of the circuit board 30. For example, the third portion 74 and top sections of the first and second portions 70, 72 (e.g., sections above the circuit board 30) may be completely wrapped/enclosed by the housing 226. With at least some configurations, the housing 226 may include a first internal wall 292 and/or a second internal wall 294 that may be substantially parallel to an X-Z plane. The first internal wall 292 may extend from a first recess 288$_1$ to a third recess 288$_3$ and may be in contact with a first lateral side of the first member 22. The second internal wall 294 may extend from a second recess 288$_2$ to a fourth recess 288$_4$ and may be in contact with a second lateral side of the first member 22.

In embodiments, a bottom wall 284 of a housing 226 may be disposed at least partially between the circuit board 30 and the first member 22. For example, the height/thickness of the bottom wall 284 may dictate the distance of the recesses 288 and/or the first member 22 from the circuit board 30 (e.g., in a Z-direction). The bottom wall 284 may include a bottom wall aperture 298 that may extend through the bottom wall in a Z-direction, such as to the aperture 286. The bottom wall aperture 298 may, for example and without limitation, include a generally rectangular configuration, which may provide the bottom wall 284 and/or an inner edge 300 thereof with generally rectangular configuration (e.g., the bottom wall may resemble a rectangular frame).

With embodiments, such as generally illustrated in FIGS. 13-15 and 19, a housing 226 may include one or more dimensions that are smaller than a housing 26. For example, a housing 226 may be wider than a third portion 44 of a first member 22, but may be narrower than a first portion 40 and/or a second portion 42 of a first member 22 such that the housing 226 does not extend beyond the recesses 50, 52 in a Y-direction, and/or such that the edges 54-60 and/or recesses 50, 52 of the first member 22 extend beyond the housing 226 in a Y-direction.

Figure 20:
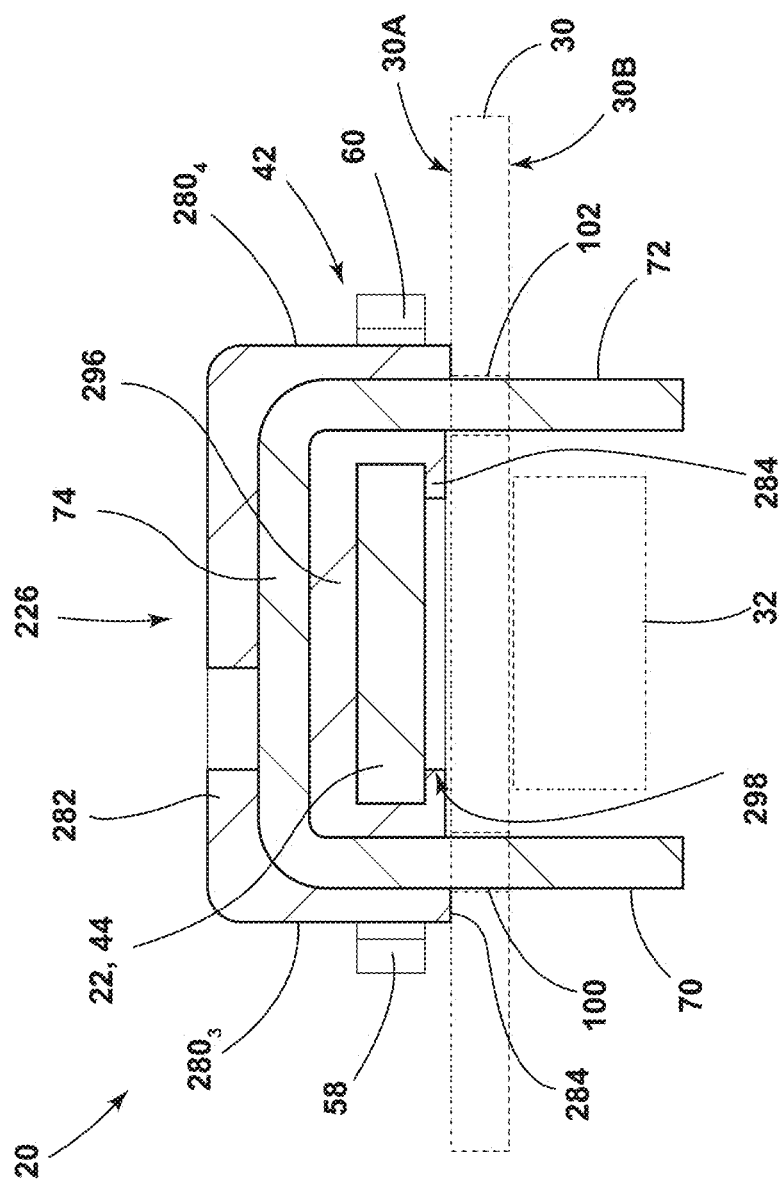
FIG. 20 is a cross-sectional view generally illustrating an embodiment of an electrical assembly.
Figure 21:
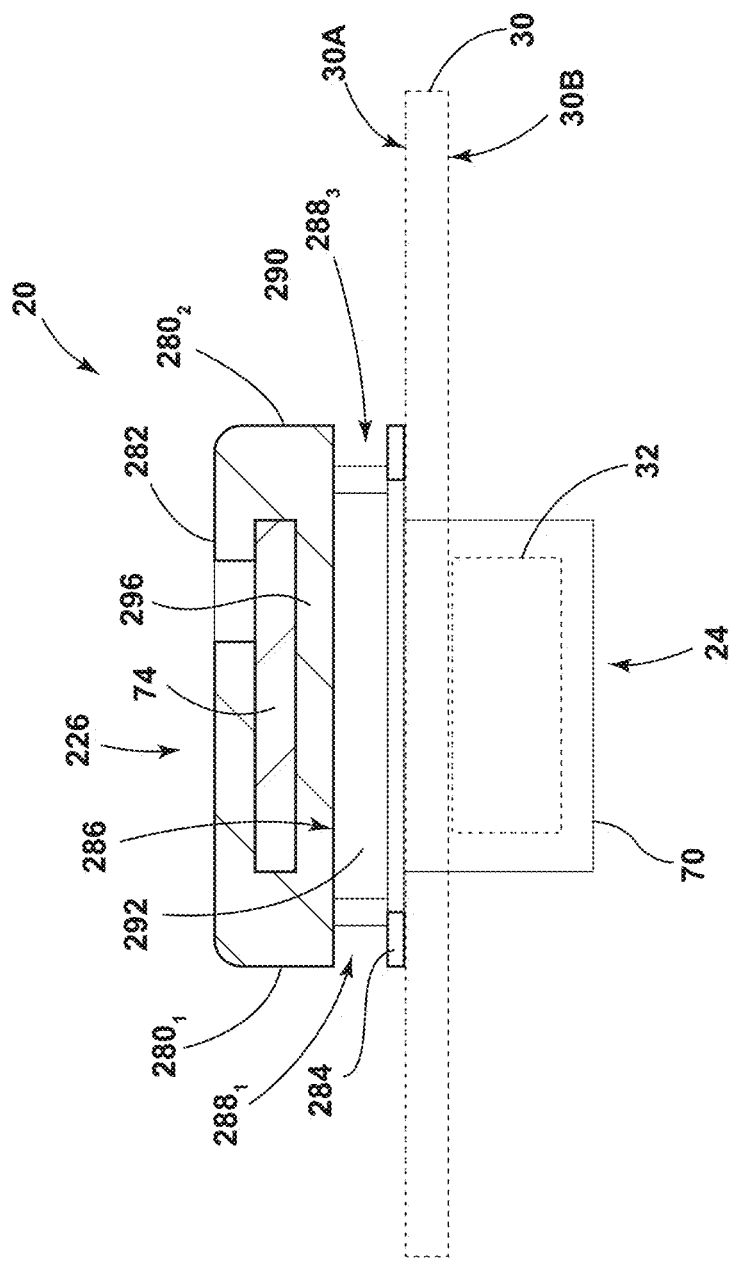
FIG. 21 is a cross-sectional view generally illustrating an embodiment of an electrical assembly with a first member hidden.
Figure 22:
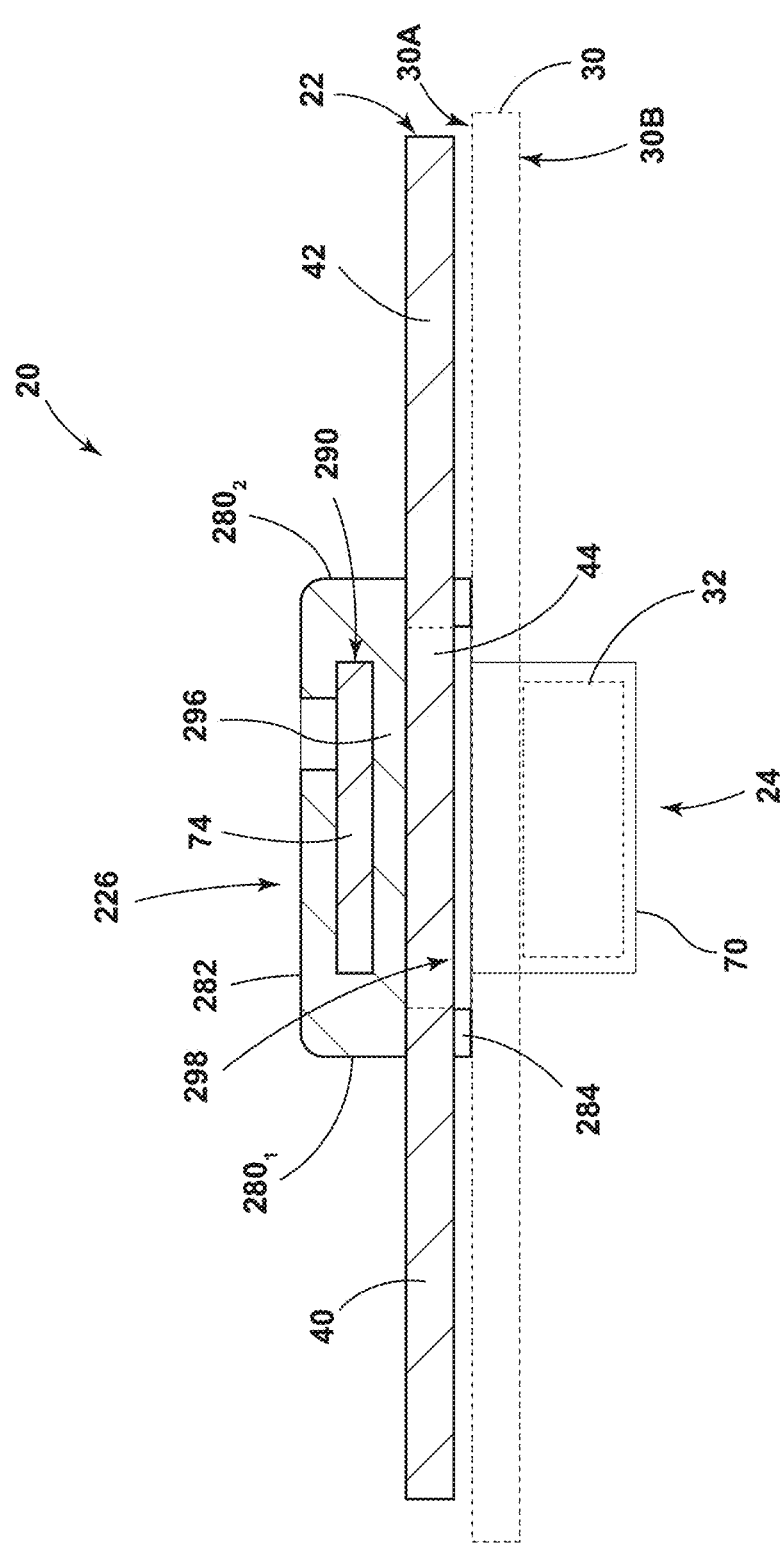
FIG. 22 is a cross-sectional view generally illustrating an embodiment of an electrical assembly.
Figures 23A, 23B:
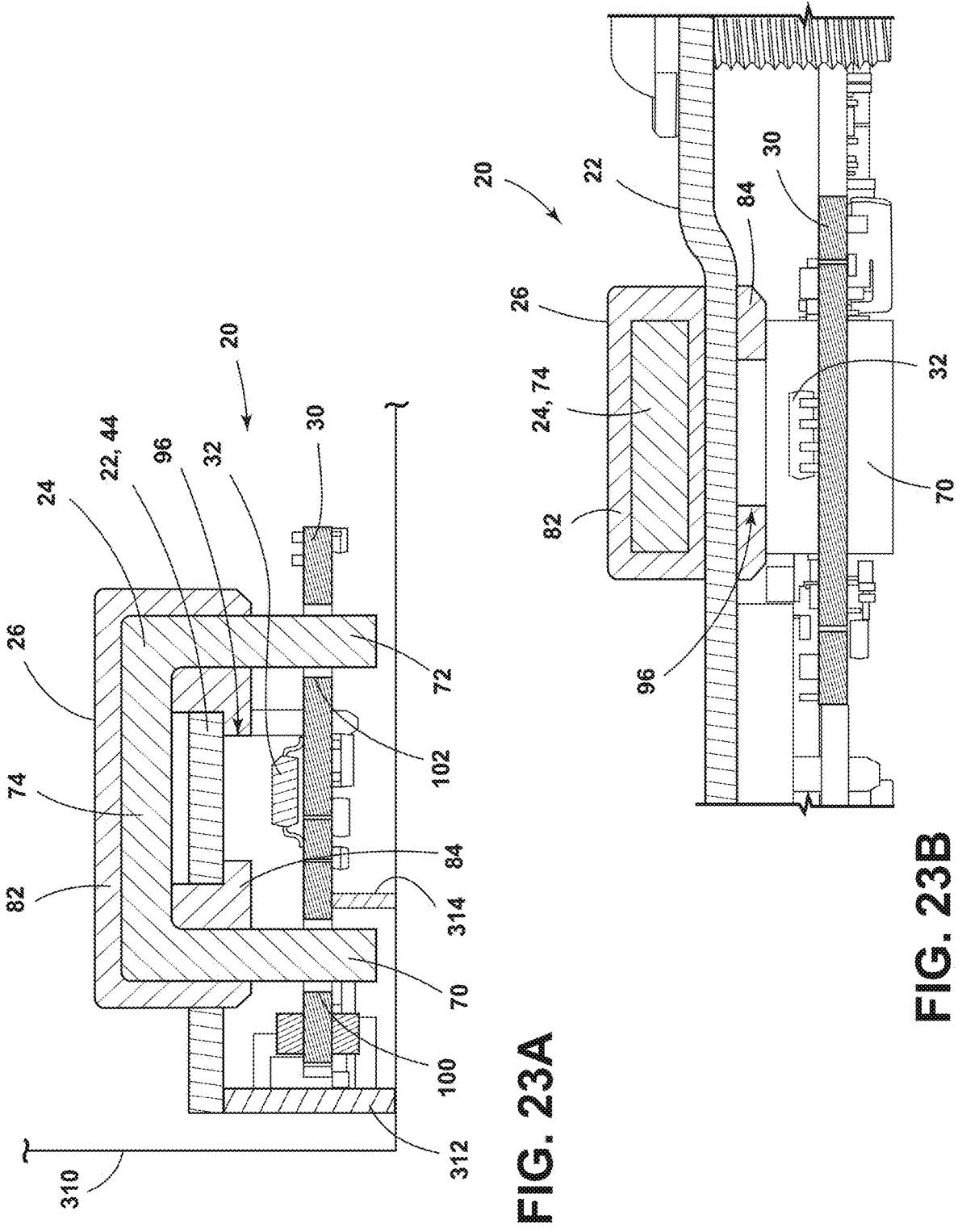
FIGS. 23A and 23B are cross-sectional views generally illustrating embodiments of electrical assemblies.
Figures 24A, 24B:
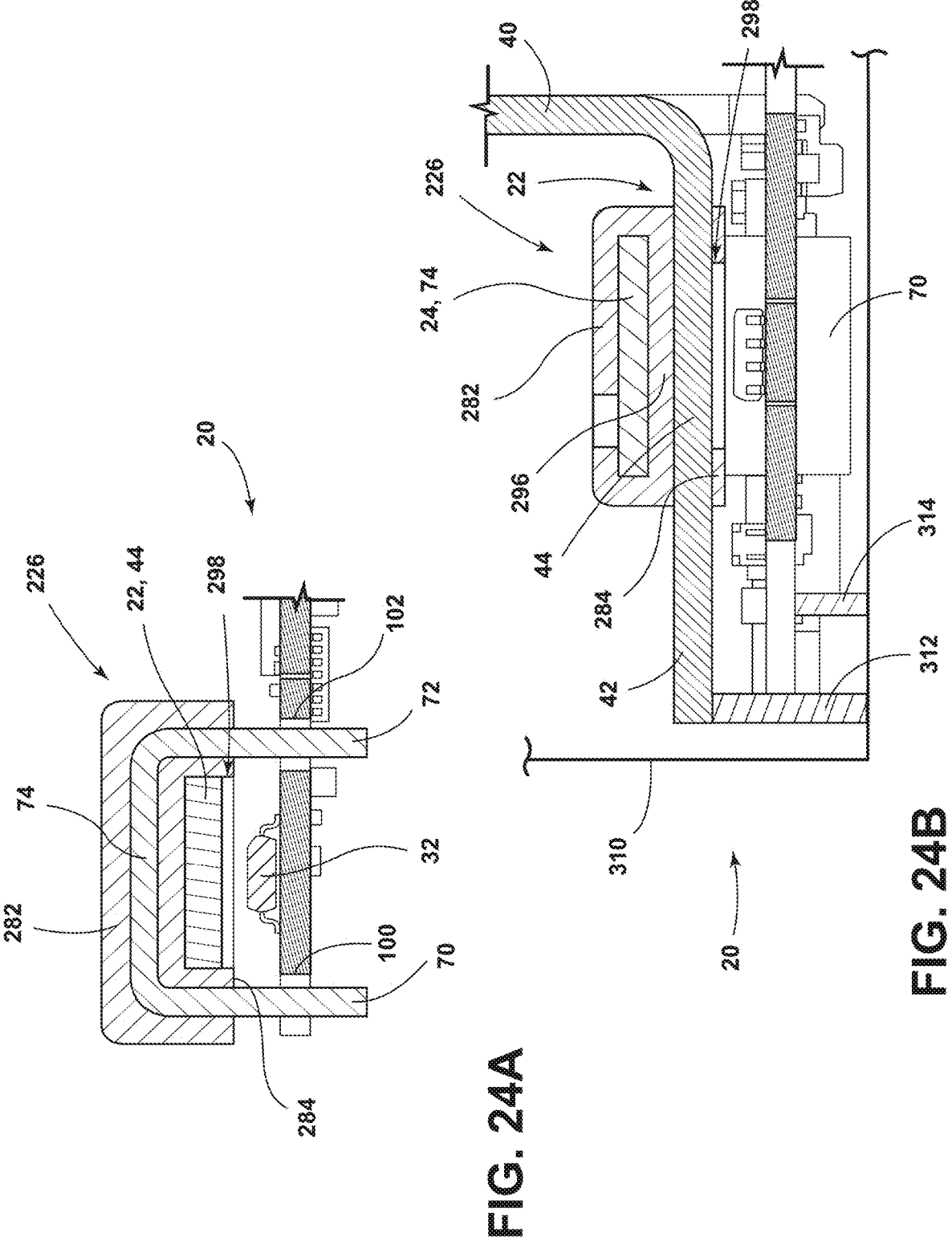
FIGS. 24A and 24B are cross-sectional views generally illustrating embodiments of electrical assemblies.
Figures 25A, 25B:
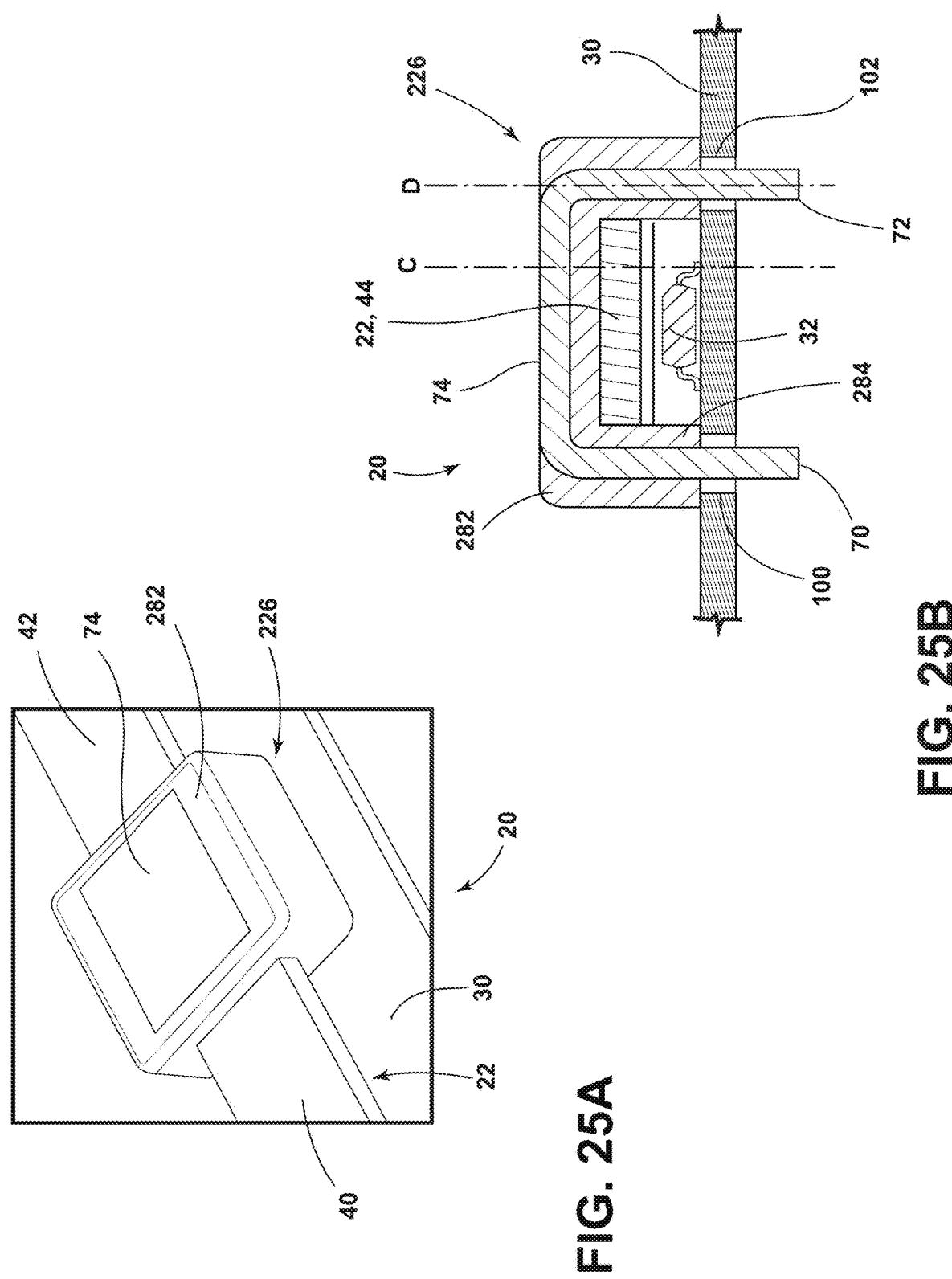
FIG. 25A is a perspective view generally illustrating an embodiment of an electrical assembly.
FIGS. 25B, 25C, and 25D are cross-sectional views generally illustrating embodiments of electrical assemblies.
Figures 25C, 25D:
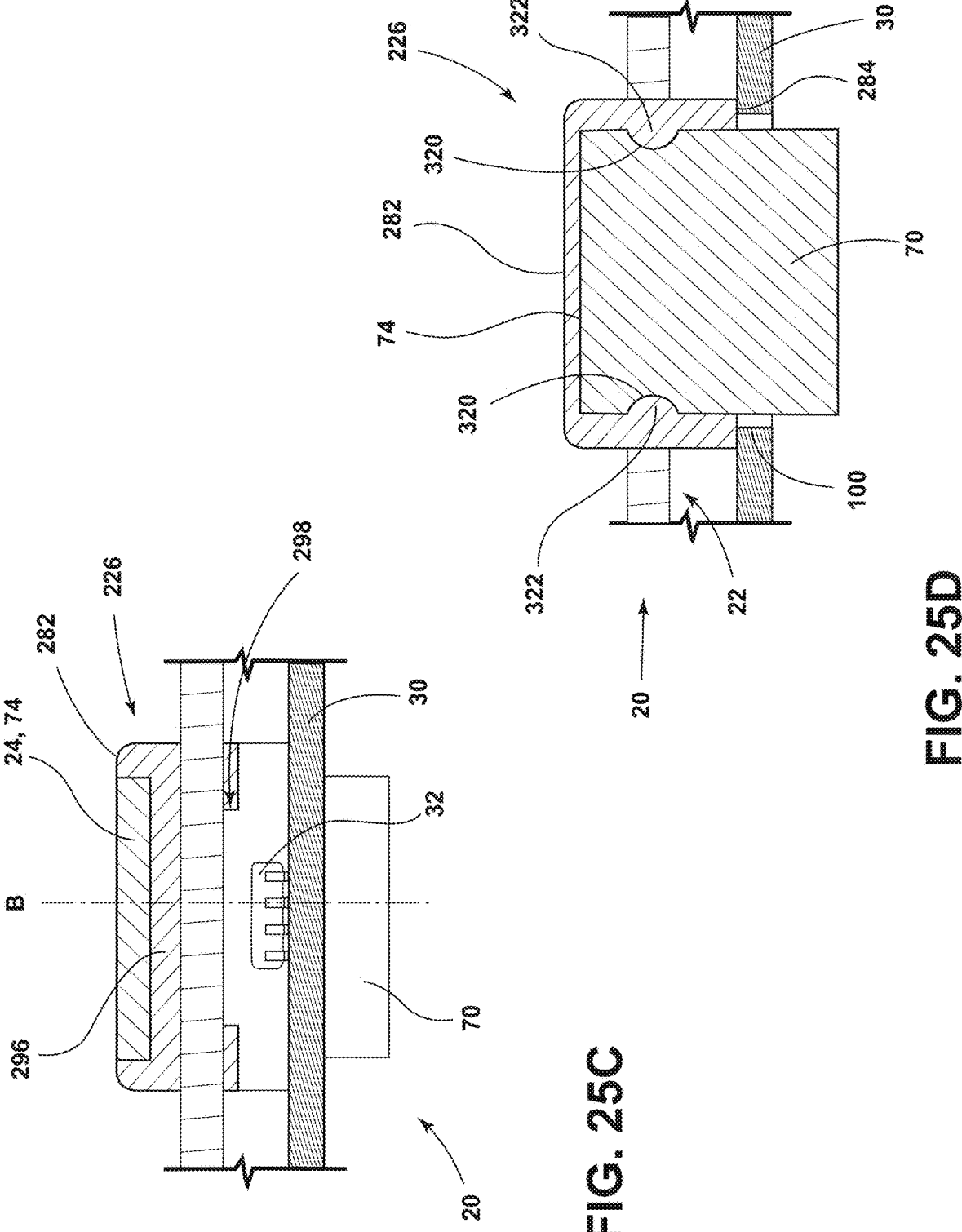

With embodiments, such as generally illustrated in FIGS. 20-22, a housing 226 may include a third internal wall 296 that may be substantially parallel to an X-Y plane. The third internal wall 296 may, for example, extend from the first side wall 80$_1$ to the second side wall 80$_2$ and/or from the first internal wall 292 to the second internal wall 294. A bottom surface of the third internal wall 296 may be in contact (e.g., planar contact) with a top surface of the first member 22. A top surface of the third internal wall 296 may be in contact (e.g., planar contact) with a bottom surface of the second member 24. The third internal wall 296 may be disposed between (e.g., in a Z-direction) the first member 22 and the second member 24. The third internal wall 296 may, for example, be disposed at least partially between the third portion 44 of the first member 22 and the third portion 74 of the second member 24. The third internal wall 296 may, for example, be substantially planar and/or rectangular. A height of the third internal wall 296 may define a distance D$_2$ between the first member 22 and the second member 24. A second member 24 may be disposed at least partially between portions of a housing 226, such as between a top wall 282 and a third internal wall 296. A first member 22 may be disposed between portions of a housing 226, such as between a third internal wall 296 that may be disposed on a top surface of the first member 22 and a bottom wall 284 that may be disposed on a bottom surface of the first member 22.

In embodiments, a housing 26, 226 may cover substantially all portions of a second member 24 that are disposed at a first side of a circuit board 30 (e.g., at or above a first surface 30A). For example, a second member 24 and/or a third portion 44 of a first member 22 may not be visible at a first side of a circuit board 30 when assembled with the circuit board 30. In some configurations, a housing 226 may cover and be in contact with substantially all sections of a second member 24 disposed at a first side of a circuit board 30 (e.g., except proximate molding apertures 508, 510). The housing 226 may not be in contact with sections of a second member 24 disposed in a circuit board 30 (e.g., in apertures 100, 102) and/or at a second side (e.g., at or below a second surface 30B) of the circuit board 30.

With embodiments, such as generally illustrated in FIGS. 23A-24B, a housing 26, 226 may be offset from (e.g., not in contact with) a circuit board 30, and/or a sensor 32 may be disposed on and/or at the same side/surface of the circuit board 30 as a housing 26, 226. For example and without limitation, a sensor 32 may be disposed on or about a first surface 30A of the circuit board 30 and a housing 26, 226 may be disposed above the first surface 30A (e.g., at a first side of the circuit board 30). In such a configuration, some or all of the housing 26, 226 and/or the first member 22 may be disposed above the sensor 32. The sensor 32 may be disposed between the first and second portion 70, 72 of a second member 24. The height of the housing 26, 226 above the circuit board 30 may be dictated, at least in part, via the height of the first member 22 above the circuit board 30, which may be dictated at least in part, via portions of an outer housing 310 of an electrical assembly 20 in which the housing 26, 226, the first member 22, the second member 24, the circuit board 30, and/or the sensor 32 may be disposed. An outer housing 310 may, for example, include one or more first columns 312 that may support a first member 22 and/or one or more second columns 314 that may support a circuit board 30. The height of the one or more first columns 312 and/or a difference in height between the first column(s) 312 and the second column(s) 314 may dictate, at least in part, the height of first member 22, a third portion 74 of a second member 24, and/or a housing 26, 226 (e.g., a bottom wall 84, 284) above the circuit board 30. The outer housing 310 and/or the columns 312, 314 may, for example and without limitation, include a thermally conductive material, such as aluminum. One or more electrical components (e.g., relays, contactors, fuses, controllers, amplifiers, etc.) may be disposed in the outer housing 310 and/or connected to the circuit board 30. The first portion 70 and/or the second portion 72 of a second member 24 may extend into and/or through apertures 100, 102 of a circuit board 30 even if a sensor 32 is disposed on the same side as a housing 26, 226 and/or if a housing 26, 226 is disposed offset from a surface 30A of the circuit board 30.

In embodiments, such as generally illustrated in FIGS. 25A-25D, a housing, such as a housing 226, may not cover substantially all of a top surface of a third portion 74 of a second member 24. Instead, most or substantially all of a top surface of the third portion 74 may be exposed/open. In some configurations, a second member 24 and/or a housing 226 may include one or more formations configured to restrict relative movement between the second member 24 and the circuit board 30. For example and without limitation, a second member 24 may include one or more recesses 320 that may be disposed in the first portion 70 and/or the second portion 72 (e.g., may extend in X-directions into edges of the portions 70, 72). The housing 226 may include one or more protrusions 322 that may extend into corresponding recesses 320. The protrusions 322 may, for example, extend into the recesses 320 such that sections of the first portion 70 or the second portion 72 are disposed directly above and directly below the protrusions 322 (e.g., in a Z-direction), which may restrict and/or prevent relative movement between the second member 24 and the housing 226. The protrusions 322 may be large enough that it may not be feasible to insert the second member 24 into the housing 226 after the housing 226 is formed. The recesses 320 and/or the protrusions 322 may, for example and without limitation, include semi-circular and/or semi cylindrical configurations.

In some configurations, such as generally illustrated in FIGS. 25A-25D, a sensor 32 and a housing (e.g., a housing 226) may be disposed at the side of a circuit board 30 and the housing 226 may contact the circuit board 30. For example and without limitation, sections of the bottom wall 284 may be in contact with the first surface 30A of the circuit board 30 and elevated sections of the bottom wall 284 (e.g., proximate a bottom wall aperture 298) may be offset in a Z-direction (e.g., perpendicular to the circuit board 30) such that the sensor 32 is disposed between the circuit board 30 and a level of the elevated sections. The housing 226 may, in some configurations, not be disposed directly between the first member 22 and the sensor 32 in a Z-direction.

Figure 26A:
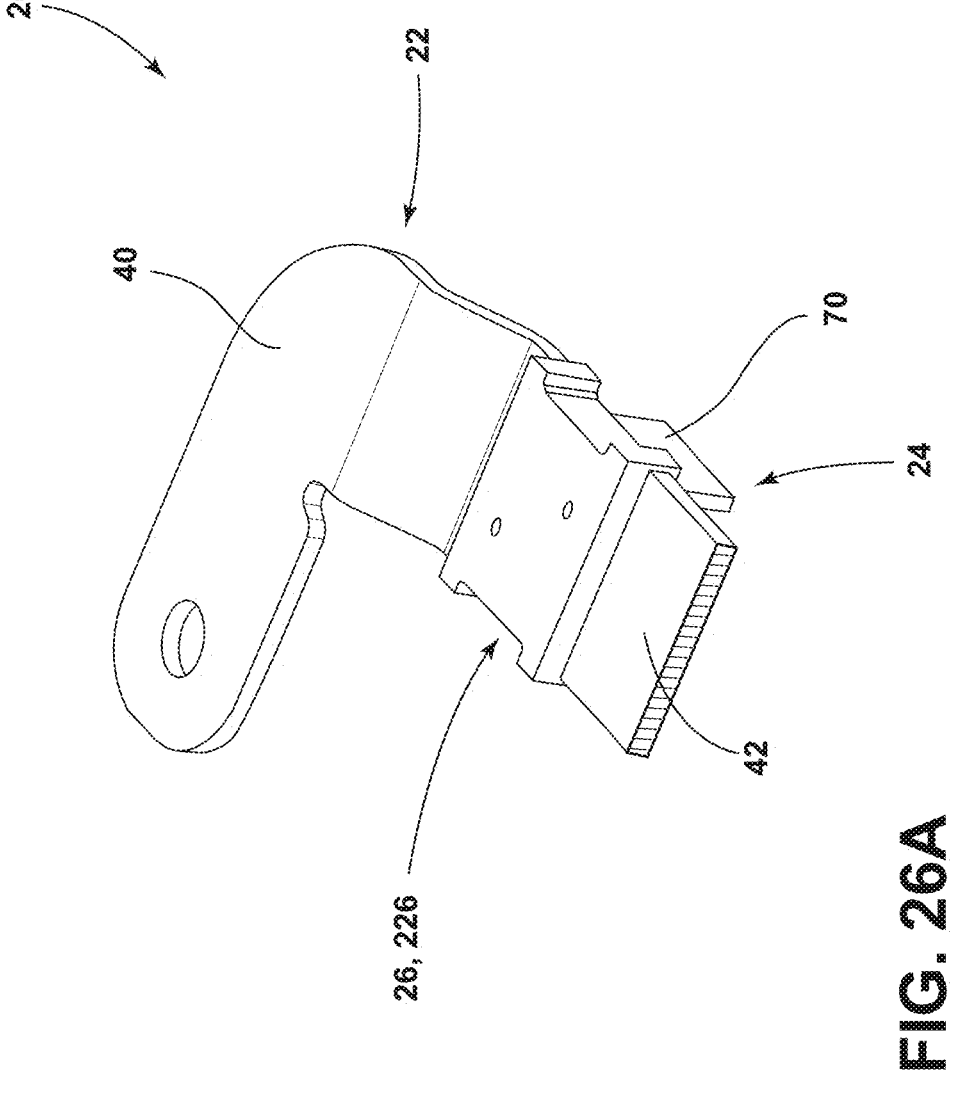
FIG. 26A is a perspective view generally illustrating an embodiment of an electrical assembly.
Figures 26B, 26C:
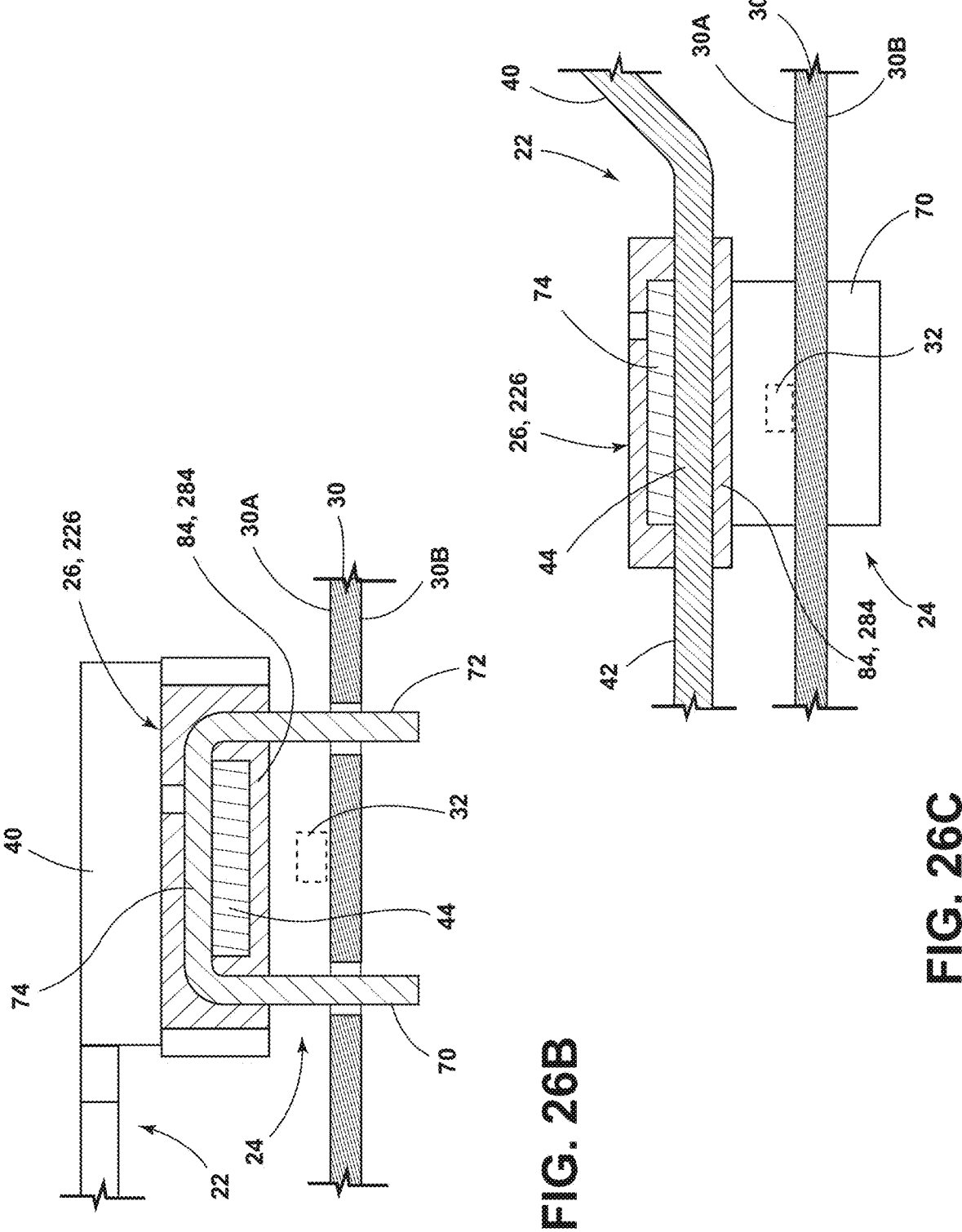
FIGS. 26B and 26C are cross-sectional views generally illustrating embodiments of electrical assemblies.

With some example embodiments, such as generally illustrated in FIGS. 26A-26C, a housing 26, 226 may be offset from (e.g., not in contact with) a circuit board 30, and/or a sensor 32 may be disposed on and/or at the same side/surface of the circuit board 30 as a housing 26, 226. For example and without limitation, a sensor 32 may be disposed on a first surface 30A of the circuit board 30 and a housing 26, 226 may be disposed above the first surface 30A (e.g., at a first side of the circuit board 30). In such a configuration, some or all of the housing 26, 226 and/or the first member 22 may be disposed above the sensor 32. The sensor 32 may be disposed between the first and second portion 70, 72 of a second member 24. The first portion 70 and/or the second portion 72 of a second member 24 may extend into and/or through apertures 100, 102 of a circuit board 30 even if a sensor 32 is disposed on the same side as a housing 26, 226 and/or if a housing 26, 226 is disposed offset from a surface 30A of the circuit board 30. In some example configurations, the first member 22 may be in contact with the second member 24. For example, an upper surface of the third portion 44 of the first member 22 may be in at least partial contact (e.g., planar contact) with a lower surface of the third portion 74 of the second member 24, which may result in distance D₂ not being present or equaling zero (e.g., a housing 26, 226 may not include a portion 104 or inner wall 296). A bottom surface of the third portion 74 of the second member 24 may be partially or substantially covered by a top surface of third portion 44 of the first member 22 (and vice versa).

While some embodiments are described and shown with first members 22 having a narrower third portion 44, other embodiments may include other configurations of first members 22. For example, wider first and second portions 40, 42 may limit movement of the first member 22 relative to a housing 26, 226 in an X-direction, and other configurations of the first and second portions 40, 42, such as asymmetry, offsets in a Y-direction (e.g., horizontal steps), and/or offsets in a Z-direction (e.g., vertical steps—see, e.g., FIG. 26A), may be utilized. Additionally or alternatively, a housing 26, 226 may be positively engaged with a first member 22 apart/away from a main current path, such as via holes or cuts filled with material (e.g., overmolded plastic) of the housing 26, 226.

Figure 27:
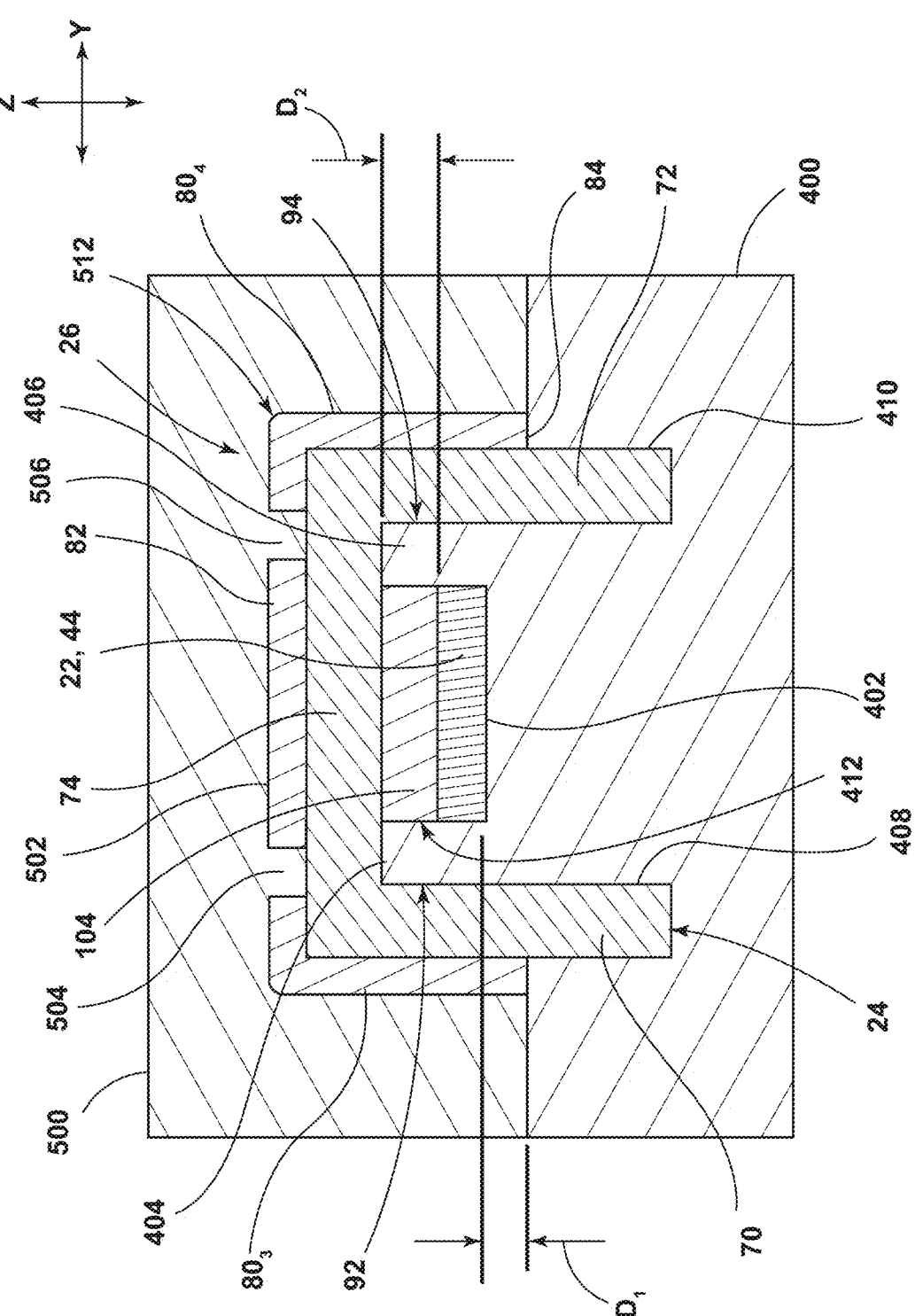
FIG. 27 is a cross-sectional view generally illustrating embodiments of an electrical assembly, a first mold, and a second mold.

In embodiments, such as generally illustrated in FIG. 27, a first mold 400 may be configured for forming a housing 26 and may include a generally rectangular configuration, a first recess 402, a second recess 408, and/or a third recess 410. The first recess 402 may open upward and/or may be defined at least in part by a first projection 404 and/or a second projection 406 that may extend upward from the first mold 400. The first recess 402 may be configured to at least partially receive the first member 22, such as the third portion 44. The depth of the first recess 402 may correspond to the thickness of the third portion 44, a desired/specified distance D₁ of the first member 22 from a circuit board 30, and/or a desired/specified distance D₂ of the first member 22 from the second member 24. For example, prior to molding, a top portion of the first recess 402 may be empty/open to receiving housing material, and/or an increased depth of the first recess 402 may decrease the size of D₁. In some circumstances, the size of D₁ may be dictated, at least in part, by the lengths of the first and second portions 70, 72 of the second member. The first projection 404 and/or the second projection 406 may be configured to support the second member 24, such as during molding. The first mold 400 may include a second recess 408 and/or a third recess 410 that may be configured to at least partially receive the first portion 70 and/or the second portion 72 of the second member 24, such as until the third portion 74 is in contact with the projections 404, 406. The projections 404, 406 may, for example, be configured to form the extensions 92, 94 of a second member recess 90.

Figure 28:
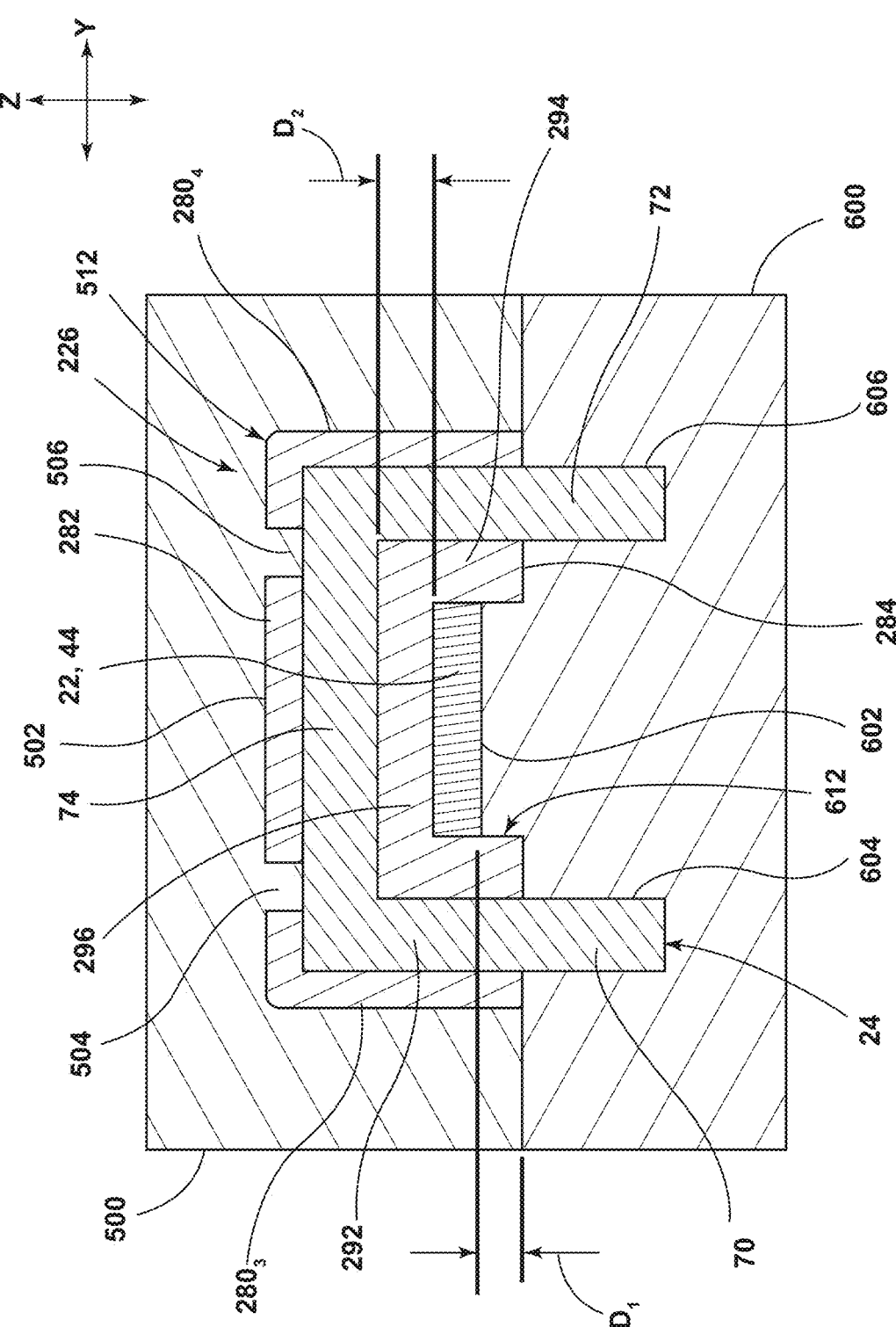
FIG. 28 is a cross-sectional view generally illustrating embodiments of an electrical assembly, a first mold, and a second mold.

With embodiments, such as generally illustrated in FIGS. 27 and 28, a second mold 500 may be configured for forming a housing 26, 226. The second mold 500 may include a recess 502 that may include a generally rectangular configuration (e.g., a rectangular prism) that may be configured to at least partially receive the second member 24, a first projection 404 of a first mold 400, a second projection 406 of a first mold 400, and/or a projection 602 of a first mold 600. The recess 502 may be larger than the second member 24 such that space is provided for forming one or more side walls 80, 280 and/or a top wall 82, 282 of a housing 26, 226. The second mold 500 may include one or more projections 504, 506 that may extend down into the recess 502 and/or into contact with the second member 24, such as to limit movement of the second member 24 during formation of the housing 26, 226. The projections 504, 506 may cause corresponding molding recesses/apertures 508, 510 to be formed in top walls 82, 282 of the housings 26, 226.

In embodiments, such as generally illustrated in FIG. 28, a first mold 600 may be configured for forming a housing 226 and may include a projection 602, a first recess 604, and/or a second recess 606. The projection 602 may extend upward from the first mold 600, such as to support the first member 22. The height of the projection 602 may correspond to a desired/specified distance D₁ of the first member 22 from a bottom of the housing 26 and/or from a circuit board 30. The first recess 604 and/or the second recess 606 may be configured to at least partially receive the first portion 70 and/or the second portion 72 of the second member 24. The depth of the recesses 604, 606 may corresponding to a desired/specified distance $D_2$ between the first and second members 22, 24. The recesses 604, 606 may be spaced from the projection 602 such that space is provided for formation of the internal walls 292, 294 of the housing 226.

With embodiments, a housing 26, 226 may be at least as long (e.g., in an X-direction) as a third portion 44 (e.g., a narrow portion) of a first member 22 and/or at least as long as some or all of portions 70-74 of a second member 24. A housing 26, 226 may, in some configurations, be taller (e.g., in a Z-direction) than a first member 22 (e.g., than a thickness of the first member 22). For example and without limitation, a housing 26, 226 may be at least twice as tall as a first member 22 and/or may not be more than about six times taller than a first member 22.

Figure 29:
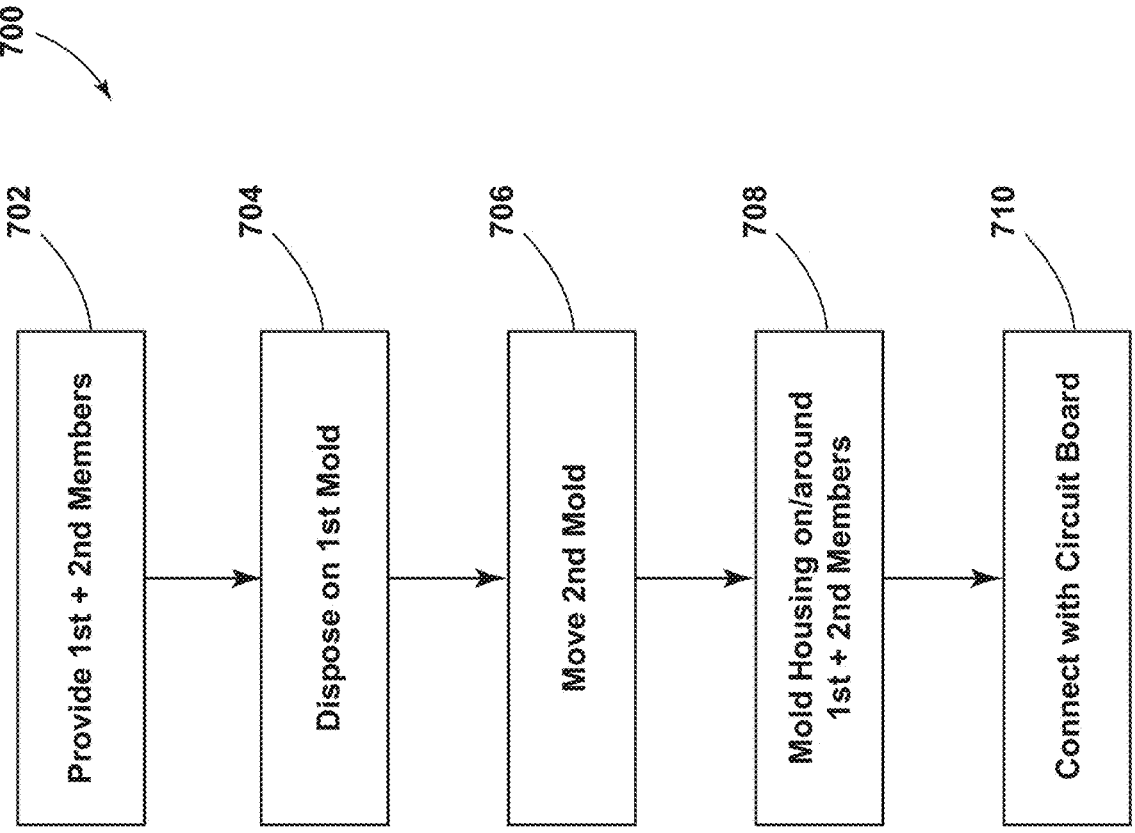
FIG. 29 is a flow chart generally illustrating an embodiment of a method of assembling an electrical assembly.

In embodiments, such as generally illustrated in FIG. 29, a method 700 of assembling an electrical assembly 20 may include providing a first member 22 and a second member 24 (block 702). The first member 22 and/or the second member 24 may be disposed in contact with (e.g., touching, on, in, etc.) a first mold 400, 600 (block 704). In some configurations, disposing the first member 22 and/or the second member 24 in contact with a first mold 400 may include (i) disposing a first member 22 (e.g., a third portion 44 and edges 54-60) at least partially in a recess 402 of the first mold 400, (ii) disposing a first portion 70 of the second member 24 at least partially in a second recess 408 of the first mold 400, (iii) disposing a second portion 72 of the second member 24 at least partially in a third recess 410 of the first mold 400, and/or (iv) disposing a lower surface of a third portion 74 of the second member 24 in contact with a first projection 404 and/or a second projection 406. A gap 412 (e.g., an air gap) may be disposed between the first member 22 and the second member 24, such as in a Z-direction with a dimension $D_2$. The gap 412 may be configured to receive housing material that may form a portion 104 of the housing 26. An example of a gap 412 is generally illustrated in FIG. 27 after being filled with housing material (e.g., liquid plastic/polymer that may then harden/solidify). In other configurations, gap 412 may not be present and $D_2$ may be zero (see, e.g., FIGS. 26B and 26C).

In other configurations, disposing the first member 22 and/or the second member 24 in contact with a first mold 600 may include (i) disposing a first member 22 (e.g., a third portion 44 and edges 54-60) in contact with a projection 602 of the first mold 600, (ii) disposing a first portion 70 of the second member 24 at least partially in a first recess 604 of the first mold 600, and/or (iii) disposing a second portion 72 of the second member 24 at least partially in a second recess 606 of the first mold 600. A gap 612 (e.g., an air gap) may be disposed between the first member 22 and the second member 24, such as in a first Y-direction, a second Y-direction, and/or a Z-direction (e.g., a vertical gap with dimension $D_2$). In other configurations, gap 612 may not be present and $D_2$ may be zero (see, e.g., FIGS. 26B and 26C). One or more sections of the gap may be substantially U-shaped. The gap 612 may be configured to receive housing material that may form a first internal wall 292, a second internal wall 294, and/or a third internal wall 296 of the housing 226. An example of a gap 612 is generally illustrated in FIG. 28 after being filled with housing material.

With embodiments, the method 700 may include moving a second mold 500 toward the first mold 400, 600 (block 706), which may include moving at least a periphery of the second mold 500 into contact with the first mold 400, 600. Moving the second mold 500 may include forming a second gap 512 between the second mold 500 and the second member 24. The second gap 512 may be configured to receive housing material that may at least partially form side walls 80, 280 and/or a top wall 82, 282. Examples of a gap 512 are generally illustrated in FIGS. 27 and 28 after being filled with housing material.

In embodiments, the method 700 may include forming/ molding a housing 26, 226 on and/or around the first member 22 and the second member 24 (block 708), which may include inserting/injecting/pouring housing material (e.g., plastic, polymer, etc.) into the first mold 400, 600 and/or the second mold 500, which may provide an intermediate component comprising a first member 22, a second member 24, and the housing 26, 226 formed thereon. Forming a housing 26, 226 may, for example, include forming one or more protrusions 322 in one or more corresponding recesses 320 of the second member 24.

With embodiments, the method 700 may include connecting the intermediate component and/or a sensor 32 to a circuit board 30 (block 710). For example, a first portion 70 and/or a second portion 72 of a second member 24 may be inserted into circuit board apertures 100, 102, and/or a first member 22 may be electrically connected (e.g., bolted, welded, soldered, etc.) with the circuit board 30 and/or one or more electrical components (e.g., contactors, relays, fuses, etc.) connected thereto.

In embodiments, a housing 26, 226, a first mold 400, 600, and/or a second mold 500 may, for example and without limitation, be configured so that during injection of housing material, molten (or not cured) housing material (e.g., plastic, resin, silicon, etc.) may flow and substantially fully fill available recesses/cavities to form the housing 26, 226. In some circumstances, if walls of a housing 26, 226 are too thin, un-filled gaps may result, and if walls are too thick, deformation may occur when material cools or cures (e.g., a significant amount of shrinking).

In embodiments, a housing 26, 226 may be formed (e.g., injection molded) directly on and/or around a first member 22 and/or a second member 24, such that the housing 26, 226 is a single, continuous body (e.g., not individual housing parts connected together). Forming a housing 26, 226 with first and second members 22, 24 may, for example, connect (e.g., fix) the housing 26, 226, the first member 22, and/or the second member 24 together, such as without play and/or without additional fasteners, connectors, or the like, which may simplify assembly, With embodiments, forming a housing 26, 226 with first and second members 22, 24 may, for example, provide consistent (e.g., substantially identical, without significant tolerances, etc.) spacing of the first member 22 and the second member 24 relative to (i) each other (e.g., distance $D_2$), (ii) a circuit board 30 (e.g., distance $D_1$), and/or (iii) a sensor 32. Such precise control of relative positioning may not be feasible if the first member 22 and the second member 24 are connected to each other or a circuit board 30 with a different process, as other connection processes may involve significant tolerances, such as if a housing is formed separately and first and second members 22, 24 are inserted thereafter, or if a first member 22 is connected to a circuit board 30 independent of a housing, among others.

In embodiments, a housing 26, 226 may be disposed on a first surface 30A of a circuit board 30, may be indirectly attached to the circuit board 30 via the first member 22 and/or the second member 24, and/or may not be directly attached (e.g., fastened, glued, etc.) to the circuit board 30. Not directly attaching a housing 26, 226 to a circuit board 30 may simplify assembly.

In embodiments, one or more apertures (e.g., apertures 86, 286) and/or recesses (e.g., recesses 88, 90, 288, 290) of a housing 26, 226 may not include open/empty space as the housing 26, 226 may be initially formed directly on/around a first member 22 and/or a second member 24, which may be disposed in the recess/aperture while the recess/aperture is formed (e.g., a recess/aperture may be formed via housing material flowing around a first member 22, a second member 24, and/or a mold 400, 500, 600).

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. An electrical assembly, comprising:
an electrically conductive first member having a first surface and a second surface opposite the first surface;
a magnetic second member; and
a housing formed over at least portions of the electrically conductive first member and the magnetic second member;
wherein the housing contacts the first surface and the second surface of the electrically conductive first member,
wherein the electrically conductive first member and the housing are disposed at a first side of a circuit board,
wherein at least a portion of the magnetic second member extends through a plurality of apertures that extends from the first side of the circuit board to a second side of the circuit board, such that a sensor and at least the portion of the magnetic second member are connected to the second side of the circuit board,
wherein the sensor is disposed, via the housing, in a center region where the electrically conductive first member and the magnetic second member overlap, and
wherein the sensor extends along the electrically conductive first member.

2. The electrical assembly of claim 1, wherein the magnetic second member includes a U-shaped configuration.

3. The electrical assembly of claim 1, wherein the housing is disposed on a top surface of the magnetic second member and on a bottom surface of the magnetic second member such that the magnetic second member is disposed partially between portions of the housing in a first direction perpendicular to the electrically conductive first member.

4. The electrical assembly of claim 3, wherein the housing is disposed on a top surface of the electrically conductive first member and on a bottom surface of the electrically conductive first member such that the electrically conductive first member is disposed between portions of the housing in the first direction perpendicular to the electrically conductive first member.

5. The electrical assembly of claim 1, wherein the magnetic second member is configured to concentrate a magnetic field generated via electrical current flowing through the electrically conductive first member to facilitate sensing of the magnetic field by the sensor.

6. The electrical assembly of claim 5, wherein the housing is disposed on a first surface of the circuit board, is indirectly attached to the circuit board via at least one of the electrically conductive first member and the magnetic second member, and is not directly attached to the circuit board.

7. The electrical assembly of claim 5, wherein a portion of the housing is disposed between the electrically conductive first member and the circuit board.

8. The electrical assembly of claim 5, wherein the housing covers substantially all portions of the magnetic second member disposed at a first side of the circuit board.

9. The electrical assembly of claim 1, wherein a bottom surface of the magnetic second member is substantially covered by at least one of the housing and the electrically conductive first member; the housing includes a first length; the magnetic second member include a first width; and the first length is the same as the first width.

10. The electrical assembly of claim 1, wherein the housing includes a through aperture, a first recess, and a second recess;

wherein a narrow portion of the electrically conductive first member is disposed in the through aperture;

a first wide portion of the electrically conductive first member is partially disposed in the first recess;

a second wide portion of the electrically conductive first member is partially disposed in the second recess; and the narrow portion is disposed between and connects the first wide portion and the second wide portion.

11. The electrical assembly of claim 1, wherein the electrically conductive first member includes a first wide portion, a second wide portion, and a narrow portion connecting the first wide portion and the second wide portion; and the housing is at least as long as the narrow portion.

12. The electrical assembly of claim 11, wherein an edge of the first wide portion is disposed in a recess of a first side wall of the housing;

an edge of the second wide portion is disposed in a recess of a second side wall of the housing; and the first wide portion is wider than the housing.

13. The electrical assembly of claim 1, wherein the housing includes a top wall having a top wall bottom surface, a bottom wall having a bottom wall top surface, and an internal wall having an internal wall top surface and an internal wall bottom surface;

the electrically conductive first member includes a first member top surface and a first member bottom surface;

the magnetic second member includes a second member top surface and a second member bottom surface;

the second member top surface is in contact with the top wall bottom surface;

the second member bottom surface is in contact with the internal wall top surface;

the first member top surface is in contact with the internal wall bottom surface; and the first member bottom surface is in contact with the bottom wall top surface.

14. The electrical assembly of claim 13, wherein the top wall partially covers the second member top surface such that at least a section of the second member top surface is exposed.

15. A method of assembling the electrical assembly of claim 1, the method comprising:

disposing the first member within and/or in contact with a first mold;

disposing the second member within and/or in contact with the first mold;

providing a second mold proximate the first mold; and inserting plastic into the first mold and the second mold to form the housing.

16. The method of claim 15, wherein the first member includes a first member top surface and a first member bottom surface;

the second member includes a second member top surface and a second member bottom surface; and inserting plastic into the first mold and the second mold includes inserting plastic such that:

the housing includes a bottom wall having a bottom wall top surface, and an internal wall having an internal wall top surface and an internal wall bottom surface;

the second member bottom surface is in contact with the internal wall top surface;

the first member top surface is contact with the internal wall bottom surface; and the first member bottom surface is in contact with the bottom wall top surface.

17. The method of claim 15, wherein inserting plastic into the first mold and the second mold includes inserting plastic such that an air gap is present on both lateral sides of the first member between the first member and the second member.

18. The method of claim 15, wherein inserting plastic into the first mold and the second mold includes inserting plastic such that substantially all space between the first member and the second member is filled by portions of the housing.

19. An electrical assembly, comprising:

an electrically conductive and substantially planar first member having a first surface and a second surface opposite the first surface;

a magnetic second member; and a housing formed over at least portions of the electrically conductive and substantially planar first member and the magnetic second member;

wherein the housing contacts the first surface and the second surface of the electrically conductive and substantially planar first member, wherein the electrically conductive and substantially planar first member and the housing are disposed at a first side of a circuit board, wherein at least a portion of the magnetic second member extends through a plurality of apertures that extends from the first side of the circuit board to a second side of the circuit board, such that a sensor and at least the portion of the magnetic second member are connected to the second side of the circuit board, and wherein the sensor extends along the electrically conductive and substantially planar first member.

\* \* \* \* \*